(12) United States Patent
Yoshida et al.

(10) Patent No.: US 6,374,484 B1
(45) Date of Patent: Apr. 23, 2002

(54) PARTS MOUNTING METHOD AND APPARATUS

(75) Inventors: Noriaki Yoshida, Ikeda; Makoto Sueki; Koji Odera, both of Kofu; Yoshihiro Yoshida, Neyagawa; Osamu Okuda; Naoyuki Kitamura, both of Yamanashi; Akira Kabeshita, Hirakata, all of (JP)

(73) Assignee: Matsushita Electric Industrial Co., Ltd., Tokyo (JP)

(*) Notice: Subject to any disclaimer, the term of this patent is extended or adjusted under 35 U.S.C. 154(b) by 0 days.

(21) Appl. No.: 09/486,661
(22) PCT Filed: Aug. 27, 1998
(86) PCT No.: PCT/JP98/03799
  § 371 Date: Feb. 28, 2000
  § 102(e) Date: Feb. 28, 2000
(87) PCT Pub. No.: WO99/12406
  PCT Pub. Date: Mar. 11, 1999

(30) Foreign Application Priority Data

Aug. 29, 1997 (JP) .............................................. 9-234223
Nov. 10, 1997 (JP) .............................................. 9-306679

(51) Int. Cl.$^7$ .......................... H01R 43/00; H05K 3/30
(52) U.S. Cl. .............................. 29/740; 29/741; 29/743
(58) Field of Search .......................... 438/125; 29/729, 29/739, 740, 741, 743, 759, 833

(56) References Cited

U.S. PATENT DOCUMENTS 5,002,448 A * 3/1991 Kamijima et al. ............ 29/739
5,010,474 A * 4/1991 Tsuruta et al. ................ 29/740
5,035,047 A * 7/1991 Harigane et al. ............. 29/740
5,079,834 A * 1/1992 Itagaki et al. ................. 29/840
5,379,514 A * 1/1995 Okuda et al. ................. 29/833
5,452,509 A * 9/1995 Suzuki et al. ................. 29/740
5,456,001 A * 10/1995 Mori et al. ................... 29/739
5,727,311 A * 3/1998 Ida et al. ....................... 29/832
5,855,059 A * 1/1999 Togami et al. ................ 29/740
6,044,169 A * 3/2000 Hirotani et al. ............. 382/145
6,176,007 B1 * 1/2001 Kashiwagi et al. ........... 29/729

FOREIGN PATENT DOCUMENTS

JP 7-288395 10/1995
JP 8-148897 6/1996
JP 9-199891 7/1997

* cited by examiner

Primary Examiner—Matthew Smith
Assistant Examiner—Lex H. Malsawma
(74) Attorney, Agent, or Firm—Wenderoth, Lind & Ponack, L.L.P.

(57) ABSTRACT

According to the present invention, a control device and a circuit board moving device controlled in operation by the control device for holding a circuit board are provided, whereby the circuit board moving device is moved to bring a component mount position on the circuit board closest to a recognition device after the circuit board moving device is moved to bring the component mount position closest to a component feed position. In the state, a circuit board mark formed on the circuit board is detected, thereby recognizing a position of the circuit board. A transfer distance for the component by a component hold device from the recognition device to the component mount position is thus shortened, enabling high-speed mounting with higher accuracy.

6 Claims, 15 Drawing Sheets

Fig.4

| MOUNT BLOCK NUMBER | MOUNT POSITION XI | MOUNT POSITION YI | MOUNT ANGLE $\theta$ | FEED POSITION NUMBER | NOZZLE NUMBER | REMARKS |
|---|---|---|---|---|---|---|
| 1 | 100 | 100 | 0 | 1 | 1 | |
| 2 | 200 | 200 | 90 | 1 | 2 | |
| 3 | 300 | 300 | 180 | 2 | 3 | |
| 4 | 400 | 400 | 270 | 2 | 4 | |
| 5 | 500 | 500 | 0 | 1 | 1 | |
| | | | | | | |

| FEED POSITION NUMBER | FEED POSITION XII | FEED POSITION YII | FEED ANGLE $\theta$ | CIRCUIT BOARD MARK NUMBER | REMARKS |
|---|---|---|---|---|---|
| 1 | 100 | 100 | 0 | 1 | |
| 2 | 200 | 100 | 0 | 1 | |
| 3 | 300 | 1000 | 0 | 2 | |
| 4 | 400 | 1000 | 0 | 2 | |
| 5 | 500 | 100 | 0 | 1 | |
| | | | | | |

| CIRCUIT BOARD MARK NUMBER | MARK POSITION X | MARK POSITION Y | CIRCUIT BOARD MARK SHAPE NUMBER | REMARKS |
|---|---|---|---|---|
| 1 | 90 110 | 90 110 | 1 | |
| 2 | 190 210 | 190 210 | 1 | |
| 3 | 290 310 | 290 310 | 2 | |
| 4 | 390 410 | 390 410 | 2 | |
| 5 | 490 510 | 490 510 | 1 | |
| | | | | |

↖ 153

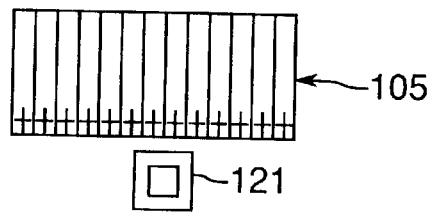
Fig.7
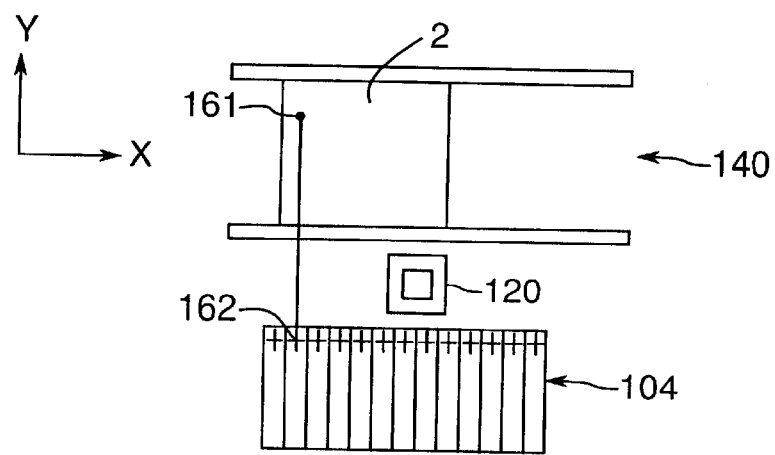
Fig.8
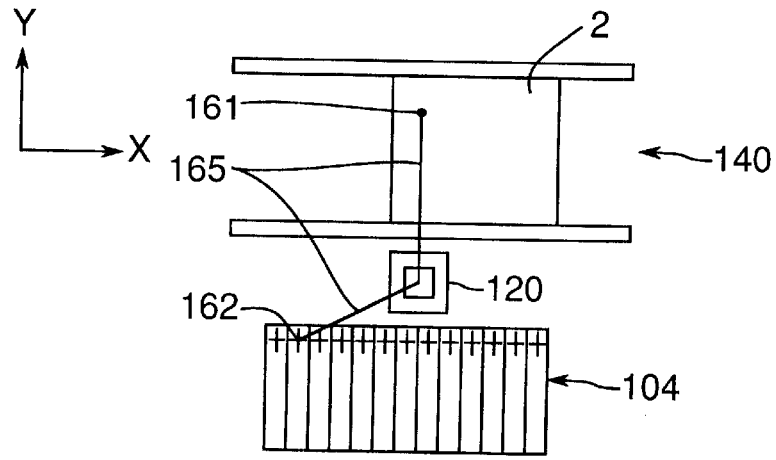

Fig.9
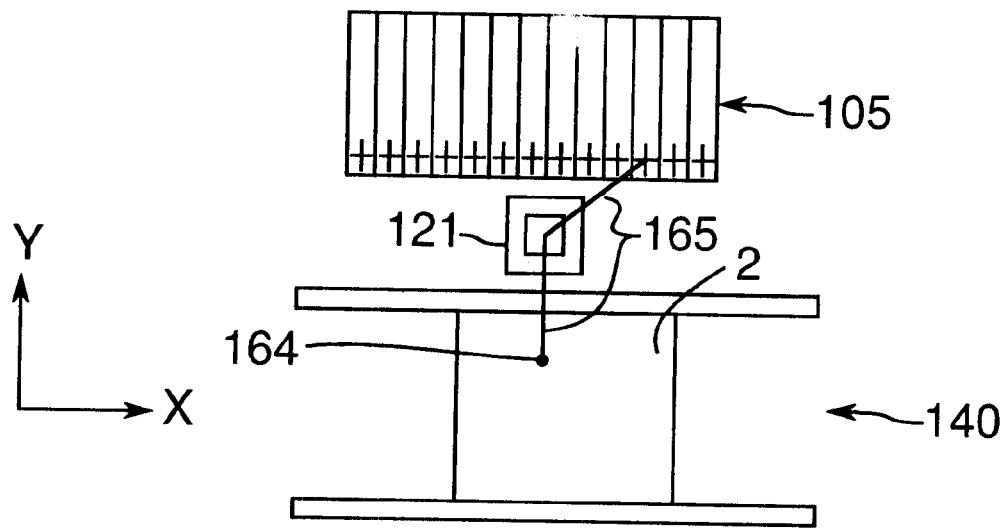
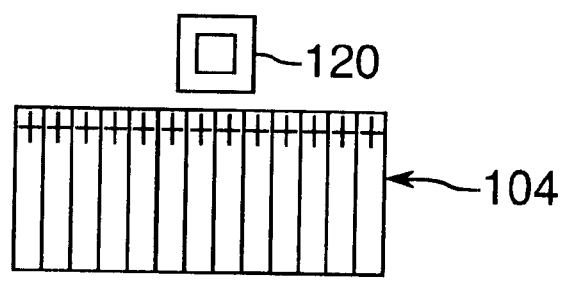

PARTS MOUNTING METHOD AND APPARATUS

TECHNICAL FIELD

The present invention relates to a method for mounting components, e.g., electronic components so as to mount the components to predetermined positions on a printed board, and a component mounting apparatus carrying out the method.

BACKGROUND ART

An electronic component mounting apparatus 1 of the related art shown in FIG. 18 for use in mounting electronic components on a printed board roughly comprises a circuit board transfer device 3 for carrying in and out circuit boards 2 to which the electronic components are to be mounted, reel-type component feed devices 4, 4 and tray-type component feed devices 6, 6 for supplying the electronic components to be mounted, a component holding device 7 which is attached to an XY-robot 5 thereby being movable in X, Y-directions for mounting an electronic component 9 held at the reel-type component feed device 4 or tray-type component feed device 6 onto the printed board 2, a component recognition camera 10 for inspecting a hold posture or the like of the electronic component 9 held by the component holding device 7 before the electronic component is mounted to the circuit board 2. The component holding device 7 is equipped with nozzles 8 for holding the electronic components 9, for example, by sucking or a like manner.

In the above electronic component mounting apparatus 1 of the related art, the circuit board 2 is fixedly positioned after being carried into the component mounting apparatus 1. That is, the circuit board 2 is not allowed to move when the component is to be mounted thereto. Instead, the component holding device 7 moves in the X, Y-directions to mount the component to the circuit board 2 after the component recognition camera 10 recognizes the electronic component 9 caught from the reel-type component feed device 4 or the like. The component holding device 7 in the related art electronic component mounting apparatus 1 moves a large distance, making it difficult to mount the component to an object at high speed with high mount accuracy.

The present invention is devised to solve the aforementioned problem. The present invention provides a method for mounting components and an apparatus for executing the method whereby components can be mounted to an object at a high speed, with improved productivity, and with higher accuracy.

DISCLOSURE OF INVENTION

In accomplishing the above-described object, the present invention features as follows.

According to a component mount method in a first aspect of the present invention, there is provided a component mount method for carrying out by a component mounting apparatus which comprises a transfer device for transferring an object to be mounted in a transfer direction along a linear transfer path, at least two component feed devices fixedly disposed at both sides of the transfer path via the transfer path in a direction orthogonal to the transfer direction for supplying components to be mounted to the object and, a component hold device which is movable both in the transfer direction and the direction orthogonal to the transfer direction, holds the component from the component feed device and mounts the component to the object, the component mount method characterized in that after the object is moved towards the component feed device for supplying the component to be held by the component hold device in order to mount the component to the object, the component is mounted by the component hold device to the object.

A component mount method according to a second aspect of the present invention may be designed so that after the object is moved toward the component feed device before mounting the component, recognition operation of an arrangement position of the object is carried out so as to correct a movement amount of the component hold device with respect to a component mount position on the object.

A component mount method according to a third aspect of the present invention may be designed so that in a case when the component mounting apparatus comprises recognition devices arranged at both sides of the transfer path via the transfer path in the direction orthogonal to the transfer direction, for recognizing the component held by the component hold device before being mounted, the object is brought to a position where a distance between the recognition device and a component mount position on the object is minimum after the object is moved toward the component feed device and before the component is mounted.

A component mount method according to a fourth aspect of the present invention may be designed so that after the object is brought to the position where the distance between the recognition device and the component mount position on the object is minimum and before the component is mounted, recognition operation of an arrangement position of the object is carried out in order to correct a movement amount of the component hold device with respect to a component mount position on the object.

According to a component mounting apparatus in a fifth aspect of the present invention, there is provided a component mounting apparatus which comprises a transfer device for transferring an object to be mounted in a transfer direction along a linear transfer path, at least two component feed devices fixedly disposed at both sides of the transfer path via the transfer path in a direction orthogonal to the transfer direction for supplying components to be mounted to the object and, a component hold device which moves both in the transfer direction and the direction orthogonal to the transfer direction, holds the component from the component feed device and mounts the component to the object, said apparatus characterized by further comprising:

an object to be mounted moving device which is connected to the transfer path, holds the object transferred along the transfer path and mounting the components, and moves an object to be mounted in at least one of the transfer direction and the direction orthogonal to the transfer direction in which the object approaches the component feed device; and a control device for controlling the object to be mounted moving device in operation so that the object is arranged at the side of the component feed device which is to supply the component to be held by the component hold device in order to mount the component to the object.

According to the component mount method in the first aspect and the component mounting apparatus in the fifth aspect of the present invention constituted as above, the control device and the object to be mounted moving device are provided, so that before the component is mounted, the object is preliminary moved towards the side where the component feed device is arranged and the component is to be held. A movement distance of the component hold device when to hold the component from the component feed device and mount to the object can hence be shortened. Thus components can be mounted at high speed, thereby improving productivity.

According to the component mount method in the second aspect of the present invention, in addition to the feature achieved by the component mount method in the first aspect, the arrangement position of the object is recognized, thereby facilitating the high-speed mounting of components. The components can be mounted to the object with higher accuracy in comparison with the component mount method in the first aspect.

According to the component mount method in the third aspect of the present invention, at the time of recognizing the component by the recognition device, the object is disposed to a position where the distance between the recognition device and the component mounted position on the object becomes minimum. In consequence, a movement distance of the component hold device after the component is recognized before the component is mounted to the object is reduced, enabling the high-speed mounting of components and improving productivity.

The component mount method in the fourth aspect of the present invention includes a recognition operation for the arrangement position of the object, in addition to the feature achieved by the above component mount method of the third aspect, whereby components can be mounted to the object at high speed with higher accuracy than in the component mount method according to the third aspect.

BRIEF DESCRIPTION OF DRAWINGS

These and other aspects and features of the present invention will become clear from the following description taken in conjunction with the preferred embodiments thereof with reference to the accompanying drawings, in which:

FIG. 4 is a diagram of contents of a mounting position data required by the component mounting method of FIG. 1.

FIG. 5 is a diagram of contents of a feed position data required by the component mounting method of FIG. 1.

FIG. 6 is a diagram of contents of a circuit board mark detection data required in the component mounting method of FIG. 1.

FIG. 7 is an explanatory diagram for an operation of a step 2 in FIG. 1.

FIG. 8 is an explanatory diagram for an operation of a step 6 in FIG. 1.

FIG. 9 is an explanatory diagram for the operation of the step 6 in FIG. 1.

BEST MODE FOR CARRYING OUT THE INVENTION

Figure 1:
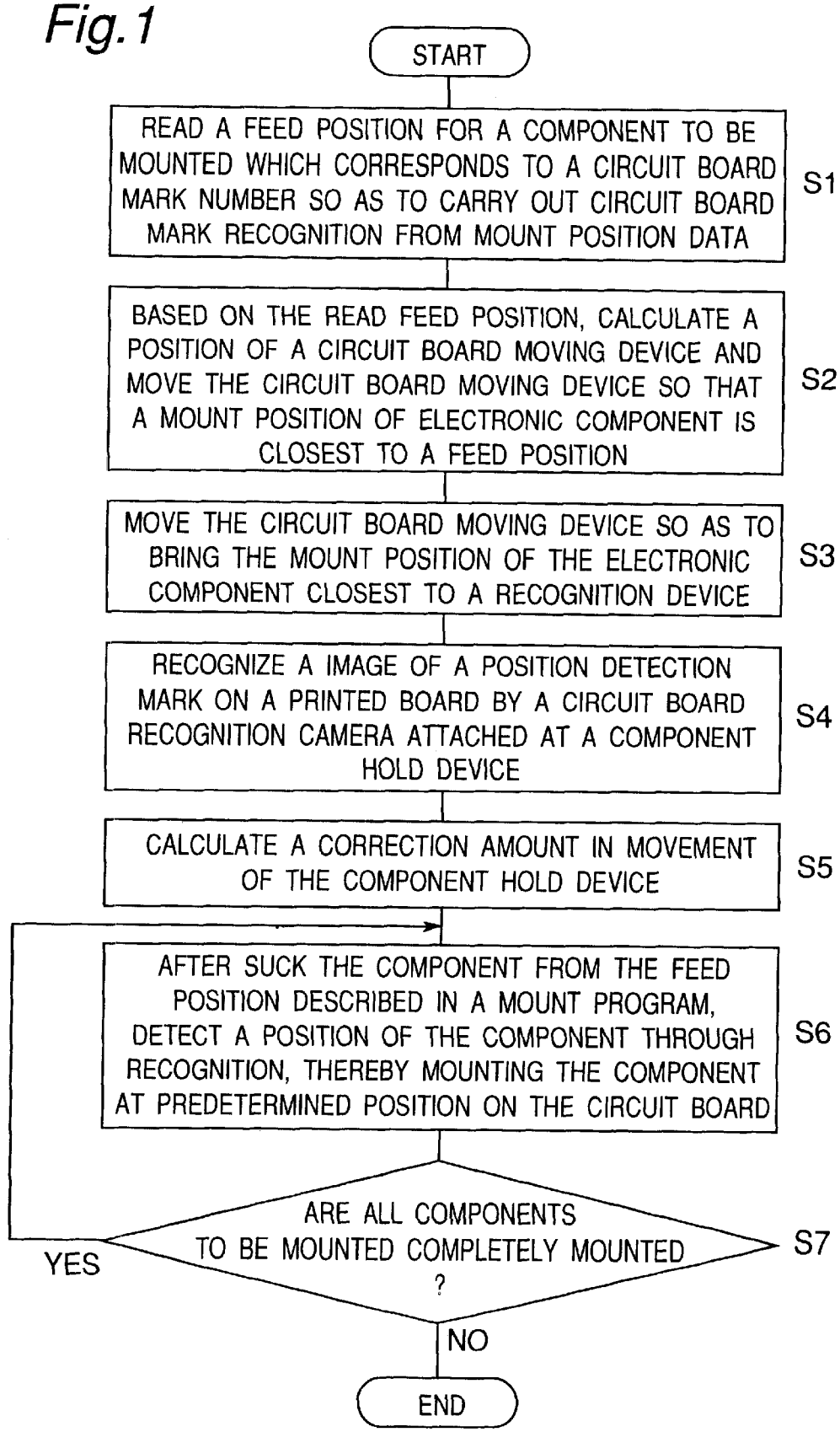
FIG. 1 is a flow chart of operations in a component mounting method according to a first embodiment of the present invention.

A component mounting method according to preferred embodiments of the present invention, and a component mounting apparatus executing the component mounting method will be described hereinbelow with reference to the drawings. It is to be noted here that like parts are designated by like reference numerals through the accompanying drawings. A circuit board and an electronic component will be discussed in the embodiments by way of examples functioning as the object to be mounted and the component described respectively in the foregoing.

DISCLOSURE OF INVENTION

First Embodiment

The description is first directed to the component mounting apparatus. A component mounting apparatus 101 in the embodiment shown in FIG. 2 includes a circuit board transfer device 103 for sending in and out circuit boards 2 in an X direction; a circuitboard moving device 140 which is connectable to the circuit board transfer device 103, holds the circuit board 2 on the occasion of a component mount operation and moves the circuit board on a plane in X, Y-directions orthogonal to each other; electronic component feed devices of a reel type 104-1, 104-2 (sometimes denoted simply as a component feed device 104), 105; an electronic component feed device of a tray type 106 in which electronic components to be mounted to the circuit board 2 are accommodated; a component holding device 107 which has a nozzle 108, i.e., a component holding member for holding, for instance, by a suction action, the electronic component from at least one of the electronic component feed devices 104, 105, and the electronic component feed device 106 and mounts the held component to a mount position on the circuit board 2; an XY-robot 115 for moving the component holding device 107 in the X, Y-directions; recognition devices 120, 121 for picking up and measuring an image of a hold posture of the electronic component held by the component holding device 107, and a control device 130 that controls at least a movement of the XY-robot 115 and circuit board transfer device 140, carries out a recognition process for images fed from the recognition devices 120, 121 thereby controlling a correction operation for a displacement between the hold posture and a mount posture of the component on the circuit board 2. In the embodiment, a lead height measurement device 122 is arranged adjacent to the recognition device 121. The lead height measurement device 122 is a device for detecting an irregular arrangement of leads of the electronic component, and is a device having laser light emission detection devices. The lead height measurement device 122 is connected to the control device 130, which calculates a height of the lead.

The component holding device 107, according to the embodiment, is equipped with four nozzles 108 and a circuit board recognition camera 109 for recognizing a circuit board position detection mark (simply referred to as a circuit board mark hereinafter) indicated on the circuit board 2. In this embodiment, components are sequentially mounted to the circuit board 2 after all the four nozzles 108 hold the components. For obtaining information for correcting a movement amount of the component holding device 107 at a mounting time, the circuit board recognition camera 109 picks up an image of the circuit board mark of a geometric shape formed on the circuit board 2 to correctly detect a position of The circuit board 2 after it is moved by the circuit board moving device 140. Two circuit board marks are allotted in the embodiment for each component mounting point where the component is to be mounted. The control device 130 recognizes picked-up images obtained from the pick-up operation thereby calculating a shift of the movement amount of the component holding device 107 with respect to an arrangement position of the circuit board 2 and an inclination of the circuit board 2, and thus corrects the movement amount of the component holding device 107.

Figure 3:
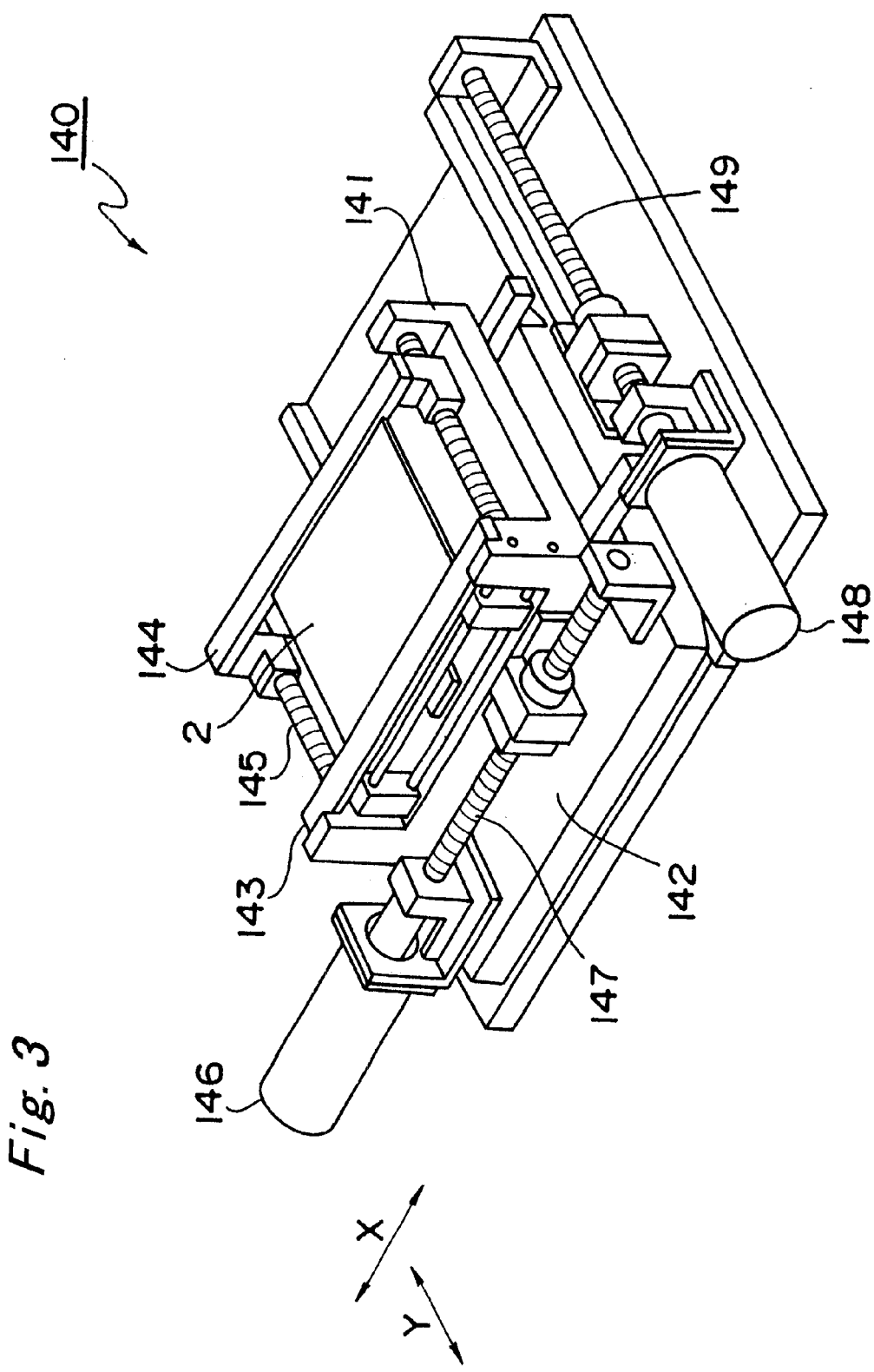
FIG. 3 is a detailed perspective view of a circuit board moving device of FIG. 2.

As shown in FIG. 3, the circuit board moving device 140 has an X table 141 and a Y table 142. The X table 141 having a catch mechanism 145 mounted for catching and holding the circuit board 2 between a fixed catch plate 143 and a movable catch plate 144 can move in the X direction by a motor 146 operated ball screw 147. The Y table 142 loading the X table 141 can move in the Y direction by a ball screw 149 through the operation of a motor 148. The fixed catch plate 143 and movable catch plate 144 are coupled to the circuit board transfer device 103. The circuit board 2 transferred by the circuit board transfer device 103 is caught by the fixed catch plate 143 and movable catch plate 144. The circuit board can accordingly be moved in the X, Y-directions by the circuit board moving device 140 at the mounting operation.

Although the circuit board moving device 140 is adapted to move both in the X and Y directions in the embodiment, the device is not limited to this so long as the device can move at least in one of the X, Y-directions.

Figure 2:
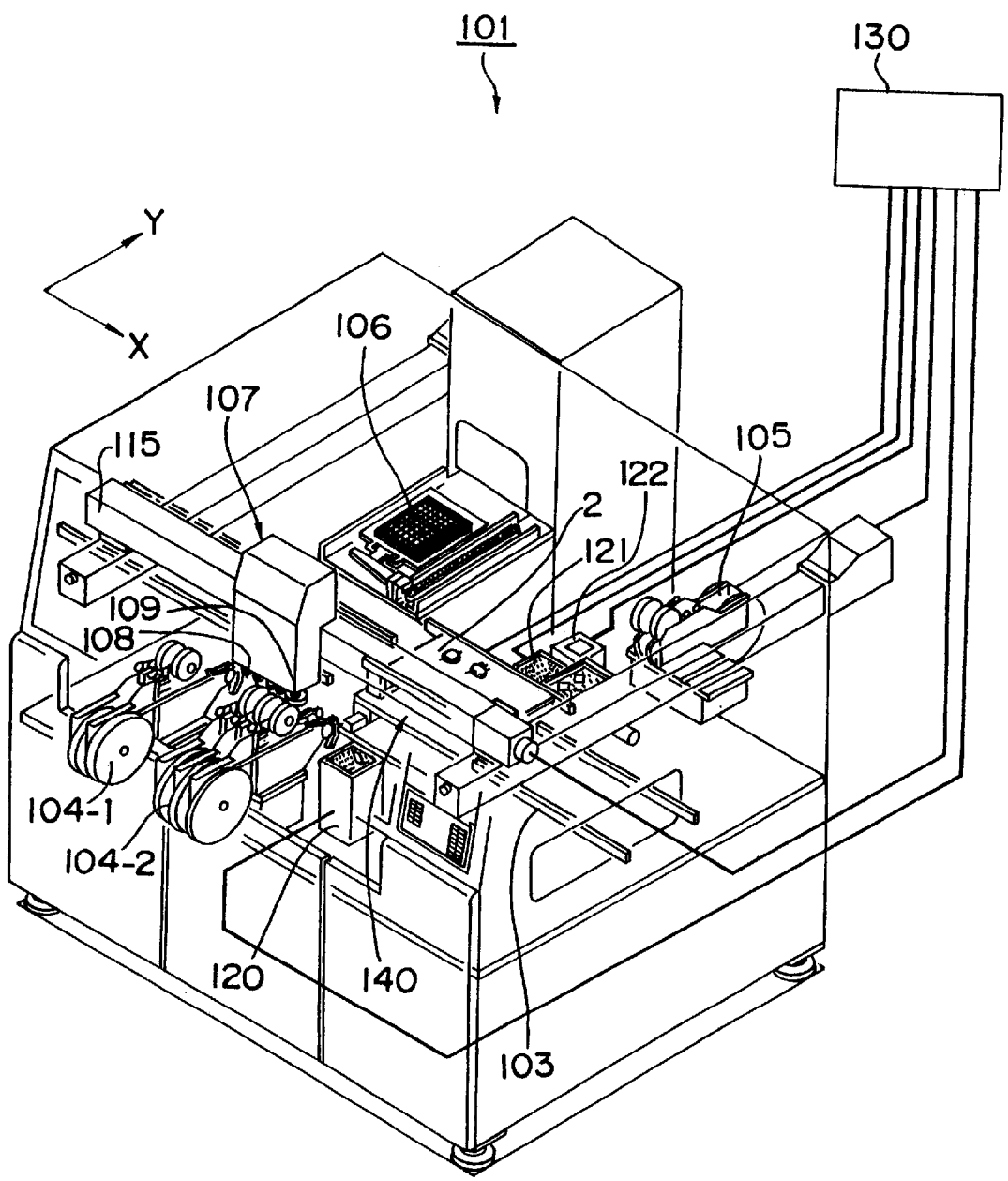
FIG. 2 is a perspective view of a component mounting apparatus in one embodiment of the present invention which carries out the component mounting method shown in the flow chart of FIG. 1.

As indicated in FIG. 2, according to the embodiment, the component feed devices 104, 105, 106 are arranged in the periphery of a range where the circuit board 2 is driven in the X, Y-directions by the circuit board moving device 140. The component feed devices 104, 105, 106 never move in the X, Y-directions to let the component holding device 107 hold the components. Moreover, in the embodiment as is clear from the drawing the component feed devices 104, 105, 106 are disposed across a transfer path extending in the X direction of the circuit board transfer device 103 at both ends in the Y direction orthogonal to a transfer direction of the circuit board. The recognition devices 121 are installed to correspond to both ends of a movement range of the circuit board moving device 140 in the Y direction, and the lead height measurement device 122 and the electronic component feed device 105 are placed adjacent to one recognition device 121.

The construction described hereinabove makes the component mounting apparatus 101 compact as a whole.

An arrangement position of the component feed devices is not restricted to the above. For example, the component feed devices can be arranged only at one side of the transfer path. Also, the number of the component feed devices is not restricted to that of the embodiment and at least two is satisfactory.

An arrangement position of the recognition devices 120, 121 is also not limited to the foregoing.

An operation of the above-discussed component mounting apparatus 101 will be depicted below.

In the first place a mounting position data 151, a feed position data 152, a circuit board mark detection data 153 are supplied to the control device 130. Referring to FIG. 4, the mounting position data 151 contains a component mounting position information indicating mounting positions of the components to the circuit board 2, and feed position numbers at the component feed device 104, and the like, which supply the components to be mounted, etc. As shown in FIG. 5, the feed position data 152 contains information related to the feed position numbers in the mounting position data 151, and the information includes circuit board mark numbers related to the circuit board marks formed on the circuit board 2. The circuit board mark detection data contains, as shown in FIG. 6, information related to the circuit board mark numbers contained in the feed position data 152.

Meanwhile, the circuit board 2 is sent by the circuit board transfer device 103 into the component mounting apparatus 101 to be held by the circuit board moving device 140.

In this state according to the present embodiment, as a first step, the control device 130 moves the circuit board moving device 140 to a position closest to a component feed point, e.g., at the component feed device 104, which is to supply the component to be mounted, in order that the circuit board mark detecting operation for mounting the component is performed at a position nearest to either of the recognition devices 120, 121, which is to pick up the hold posture of the component (steps 1 and 2 denoted by S1 and S2 in FIG. 1). In step 3, since the component held by the component holding device 107 is positioned above the recognition device 120 or recognition device 121 to recognize the component at the mounting process, the control device 130 moves the circuit board moving device 140 so as to bring a component mounting position on the circuit board 2 to be closest to the recognition device 120, or 121, at the side of the component feed device 104 which is to supply the component. This minimizes a movement distance of the component hold device 107 from the recognition device 120, or 121, to the component mounting position.

In step 4, the circuit board mark formed on the circuit board 2 held at the circuit board moving device 140 is detected.

The operation in steps 1–4 will be more fully described. In step 1, the control device 130 reads out the "feed position number" included in the mounting position data 151 of FIG. 4 in accordance with a mounting order for the component to the circuit board 2, thereby recognizing a feed position of the component to be mounted. More specifically, in the embodiment, "1" in the "feed position number" in FIG. 4 corresponds to, e.g., the component feed device 104-1 of FIG. 2, "2" in the "feed position number" corresponds to, for example, the component feed device 104-2, and "3" in the "feed position number" although not indicated in FIG. 4 corresponds to, for example, the component feed device 105 of FIG. 2. A correspondence of these "feed position numbers" and the component feed devices 104, 105, 106 is stored beforehand in the control device 130. Based on the read-out "feed position number", the control device 130 obtains a feed position XII and a feed portion VII corresponding to the above "feed position number" with referring to the feed position data 152 of FIG. 5. For instance, in the case where the "feed position number" is "1", "100, 100" is read out as the feed position XII and feed position YII is as apparent from FIG. 5. If the "feed position number" is "2", "200, 100" is read out.

After reading out the "feed position number", the control device 130 moves the circuit board moving device 140 in step 2 so that the component mount point on the circuit board 2 becomes closest to the component feed point at the corresponding component feed device. According to the present embodiment, as described earlier, the mounting for the components to the circuit board 2 is carried out after all of the four nozzles 108 of the component holding device 107 are operated to hold the components. Therefore there is a matter of how the circuit board moving device 140 is moved correspondingly to the component feed point where the component held with a nozzle among the four nozzles is supplied. Thus in the embodiment, the circuit board moving device 140 is moved to the component feed point corresponding to the feed position number of a fourth nozzle 108 among the four nozzles, so as to make the movement distance of the component holding device 107 after the fourth nozzle 108 holds the component last among the four nozzles smaller than that after any of the other nozzles holds the component. This thereby decreases the danger that the movement of the component holding device 107 intending to hold the component causes the components already held by the nozzles 108 to drop, etc. For example, the "feed position number" corresponding to a "nozzle number" of "4" is, as is shown in FIG. 4, "2", and therefore the circuit board moving device 140 is moved under the control by the control device 130 towards an area where the component feed device 104-2 is arranged, more specifically, so as to bring the component mounting point on the circuit board 2 closest to the feed position XII and feed position YII "200, 100" indicated in FIG. 5.

The nozzle number which is a reference for reading out the above "feed position number" is preferably 4 because of the above-discussed reason. However, the nozzle number is not limited to this and can be set appropriately in accordance with a mounting condition. In the construction of the present embodiment where the lead height measurement device 122 is disposed adjacent to only one recognition device 121 of the two and when the lead height measurement device 122 is in service, the circuit board moving device 140 may be brought near the component feed device at the side of the lead height measurement device 122, with priority over the selection of the "feed position number" based on the nozzle number.

As shown in FIG. 2, in the embodiment, the lead height measurement device 122 is arranged at the side where the tray type electronic component feed device 106 is prepared, because the number of times of movements of the circuit board moving device 104 can be reduced since the electronic components requiring a lead height measurement are supplied often from the tray type electronic component feed device 106.

The operation in the steps 1 and 2 will be discussed in relation to the component feed device 104-1 and the component feed device 105 of FIG. 2 as the component feed device and with reference to FIG. 7. The circuit board moving device 140 is controlled in movement by the control device 130 to make a mounting position 161 on the circuit board 2 closest to a feed position 162 of the component feed device 104-1.

In step 3 as shown in FIG. 8, the control device 130 moves the circuit board moving device 140 so that the mounting position 161 on the circuit board to which the held component is to be mounted approaches most closely to the recognition device 120 or recognition device 121.

FIGS. 7 and 8 are explanatory diagrams for the movement of the circuit board moving device 140. A positional relationship of the component feed device 104 and recognition device 120 and a positional relationship of the component feed device 105 and recognition device 121 are sightly different from in the actual apparatus.

In step 4, the control device 130, by referring to the circuit board mark detection data 153 of FIG. 6, reads out a "mark position" of the circuit board mark formed on the circuit board 2 correspondingly to the mounting position of the component to be mounted. In the above example, the control device 130 by referring to the feed position data 152 of FIG. 5 reads out the circuit board mark number "1" which corresponds to the "feed position number" "2" leaded in the case where the "nozzle number" is "4". The control device 130 then reads out the "mark positions X, Y" and a "circuit board mark shape number" corresponding to the circuit board mark number "1" with reference to the circuit board mark detection data 153 of FIG. 6. In this case, as is clearly understandable from FIG. 6, the mark positions X and Y of the two circuit board marks are respectively "190, 210" and "190, 210" and, the mark shape number is "1" of circuit board marks. Although not shown in the tables, shapes of the circuit board marks formed on the circuit boards 2 are preliminary determined corresponding to the circuit board mark shape numbers, which are identified by the control device 130. The control device 130 can accordingly judge a coincidence or incoincidence of the mark shape corresponding to the circuit board mark shape number and an image of the mark shape picked up by the circuit board recognition camera 109 of the component holding device 107. Circuit board marks of all the components to be mounted are identified beforehand in the embodiment.

Although each circuit board mark is an additionally formed mark on the circuit board 2 in the embodiment, for instance, a part of a wiring on the circuit board 2 can be utilized and recognized as the circuit board mark.

A judgment process of judging the presence/absence of the other circuit board marks to be detected may be added after the step 4 before the step 5, although not indicated in FIG. 1.

The control device 130 moves the component holding device 107 by way of the XY-robot 115 on the basis of the read-out information on the mark positions and makes the circuit board recognition camera 109 of the component holding device 107 pick up images of the circuit board marks.

A movement correction amount for the component holding device 107 is calculated in step 5. Specifically, the circuit board moving device 140 and the component holding device 107 are moved separately as described above. Thus, in the absence of a shift in movement amount between the circuit board moving device 140 and the component holding device 107, a center position of an image area of the picked-up circuit board mark agrees with the information on the mark position, and therefore it is not necessary to correct the movement amount of the component hold device in this case. On the other hand, if the center position disagrees with the information on the mark position, the control device 130 sets a shift amount thereof as a correction amount for the movement of the component holding device 107. Since the circuit board mark is formed at two symmetric points on a diagonal line passing the mounting position of the component to be mounted as described earlier, the control device 130 calculates an inclination of the circuit board 2. The inclination of the circuit board is based on a line connecting the two points and a line connecting the center positions of the two image areas of the picked-up two circuit board marks. The calculated inclination is then set as a correction amount of the inclination for correcting the component holding device 107.

In step 6, based on the mounting position data 151 of FIG. 4 and the feed position data 152 of FIG. 5, the component holding device 107 holds the component from a predetermined component feed position, e.g., the component feed position 162 of FIG. 8 under the control of the control device 130, then places the component above the recognition device 120. The recognition device 120 picks up an image of the component. The control device 130 checks a hold posture of the component based on the image obtained in the pick-up operation and makes the component holding device 107 correct the hold posture. In the embodiment, the component holding device 107 holds the component by sucking with the use of the nozzle 108, and therefore, the hold posture is corrected by rotating the nozzle 108 about its axis.

The component holding device 107 has four nozzles 108 in the embodiment as discussed before. The nozzles 108 of the component holding device 107 are sequentially positioned through the control of the control device 130 to respective component feed positions for the electronic components to be held, so that the electronic components are continuously sucked. After every of the four nozzles 108 sucks the electronic component, the component holding device 107 is moved by the XY-robot 115 to above the recognition device 120, where the hold posture of the electronic component by each nozzle 108 is picked up by the recognition device 120. The hold posture correction operation is carried out for each nozzle 108.

In step 7, the component corrected in hold posture is loaded to the mount position 161 by the component holding device 107. A line designated by a reference numeral 165 in FIG., 8 and FIG. 9 to be described later is a transfer route of the component held by the component holding device 107.

According to this embodiment, the circuit board moving device 140 is adapted to move the circuit board 2 in a manner so that the mounting position on the circuit board 2 where a first one of the four nozzles 108 of the component holding device 107 is to mount the component, is closest to the recognition device 120. After the component holding device 107 is moved by the XY-robot 115 to position to the mount position the electronic component to be mounted first, the component is mounted on the circuit board 2. The mounting operations for a second to a fourth component are sequentially carried out in the same manner afterwards by moving the component holding device 107 by the XY-robot 115, In step 8, it is judged whether all of the components to be mounted are mounted on the circuit board 2. The operation returns to the step 6 when components to be mounted still remain. The operation is terminated if no component is left to be mounted.

According to the above embodiment, as is clear from FIG. 8, the circuit board moving device 140 moves the circuit board 2 to bring the component mounting position 161 on the circuit board 2 closest to the component feed position, and thereafter the circuit board moving device 140 moves the circuit board 2 to bring the mounting position 161 on the circuit board 2 closest to the recognition device 120. For example, in the case where the component holding device 107 is equipped with four nozzles 108 as above, the circuit board moving device 140 is moved to the component feed device, which is to feed the electronic component to be held by a fourth nozzle, i.e., the nozzle which holds the electronic component last. Further, the circuit board moving device 140 is moved to bring the mounting position 161 on the circuit board 2, where a first of the four nozzles 108 is to mount the component first, so as to mount the component closest to the recognition device 120 arranged at the side of the above component feed device.

Accordingly, the circuit board 2 is preliminary moved to the area having the component feed device from which the component holding device 107 is to hold the electronic component. Therefore, the movement amount of the component holding device 107 from the component feed position to the recognition device 120 and that from the recognition device 120 to the component mounting position 161 on the circuit board 2 are reduced in comparison with the related art. The components can thus be mounted to the circuit board 2 at high speed, therefore productivity can be improved.

Further, in the state while the mounting position 161 on the circuit board 2 is arranged to be closest to the recognition device 120, the circuit board marks on the circuit board 2 are detected, whereby the correction amount in movement of the component holding device 107 is calculated. Since the correction amount is calculated with the movement amount of the component holding device 107 being reduced as compared with the related art, consequently, the held component can be sent to the mount position on the circuit board 2 with a higher accuracy than in the related art. Moreover, since the circuit board mark is formed for every mounting position of each component, the correction amount can be calculated for each component. All components can eventually be mounted to the circuit board 2 with high accuracy.

Referring to FIG. 9, if a component feed position 163 is changed from the component feed device 104 to the component feed device 105, the circuit board moving device 140 operates in steps 2 and 3 to bring a component mounting position 164 on the circuit board 2 to be closest to the component feed position 163 and the recognition device 121.

Figure 10:
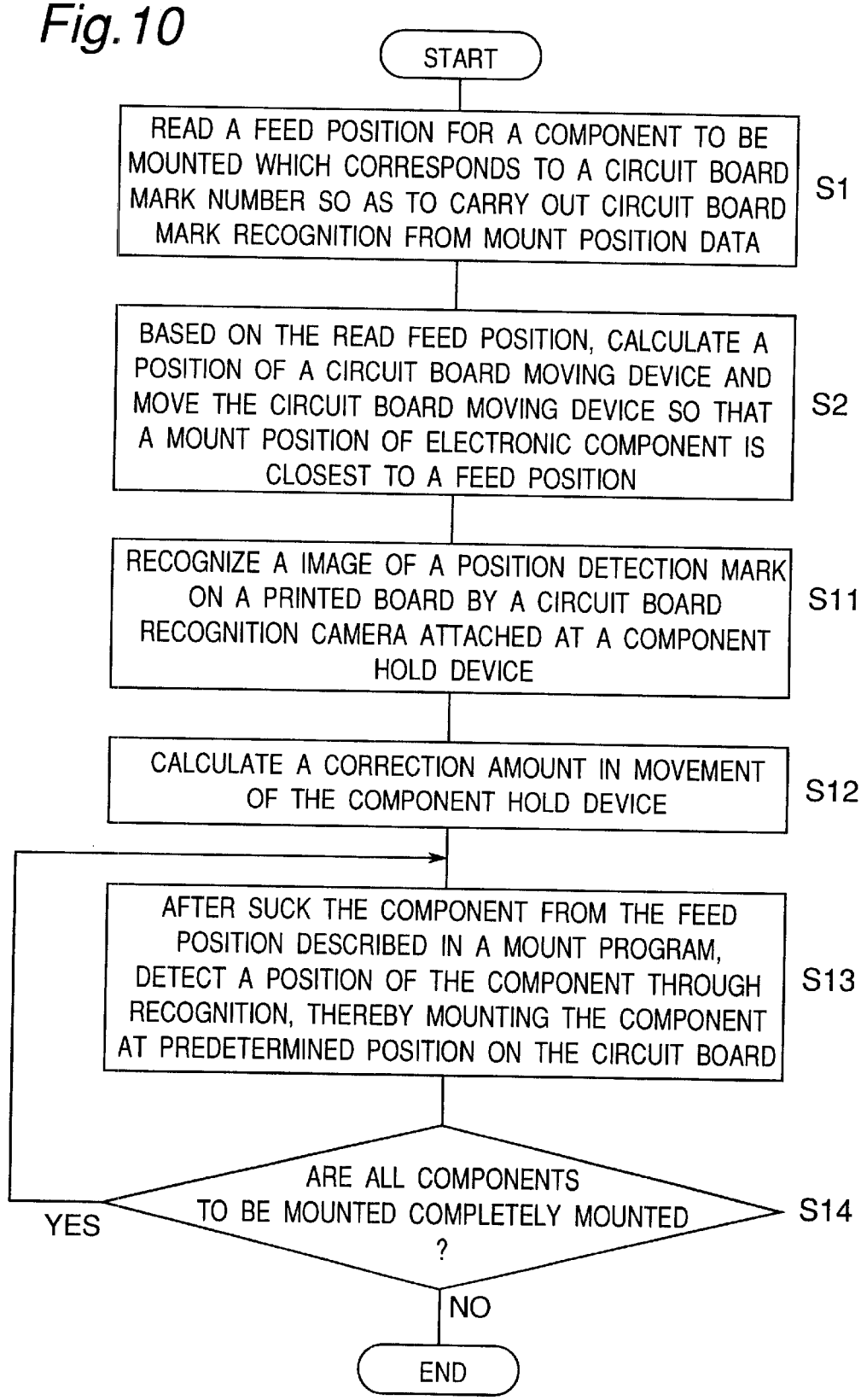
FIG. 10 is a flow chart of operations in a modified example of the component mounting method of FIG. 1.

In the embodiment at described hereinabove, the circuit board moving device 140 is constructed so as to approach the recognition device after moving to the component feed device storing the component to be mounted to the circuit board 2. However, the construction is not limited to this. For instance, such an arrangement can be adopted that the circuit board moving device 140 moves only to the component feed device storing the component to be mounted to the circuit board, with the movement to the recognition device being eliminated. The operation of FIG. 10 is carried out in this case. Specifically, step 11 is executed after the operation in steps 1 and 2, thereby recognizing an image of the position detection mark. The correction amount in movement of the component hold device is calculated in step 12 following step 11. The component is actually mounted to the circuit board 2 in step 13 after step 12. The steps 11 and 12 may be omitted.

Even when the circuit board moving device 140 is devised to move only to the component feed device, the movement amount of the component holding device 107 from the component feed position to the component mounting position on the circuit board 2 can be reduced in comparison with the related art, enabling the components to be mounted at a high speed to the circuit board 2 and improving productivity. With the addition of the steps 11 and 12, the correction amount for the movement of the component holding device 107 can be calculated in a state where the movement amount of the component holding device 107 is reduced as compared with the related art. Accordingly, the held components can be moved to the mount position on the circuit board 2 more accurately than in the related art.

Second Embodiment:

A second embodiment is related to a component mounting apparatus of a type having the circuit board moving device driven only in the Y direction. More specifically, the component mounting apparatus to be described below includes the circuit board moving device of a model moving only towards the component feed device storing the components to be mounted to the circuit board 2 and eliminating the movement to the recognition device.

A loading part 332 and an unloading part 334 in a component mounting apparatus 401 to be discussed below correspond to the transfer device 103 of the foregoing component mounting apparatus 101. A cassette type component feed part 313 and a tray type component feed part 308 of the component mounting apparatus 401 correspond to the component feed devices 104, 105 and the component feed device 106 of the component mounting apparatus 101 respectively. Further, a mounting head 321 of the component mounting apparatus 401 corresponds to the component holding device 107 of the component mounting apparatus 101, and recognition cameras 371, 372 installed in the component mounting apparatus 401 correspond to the recognition devices 120, 121 of the component mounting apparatus 101. A control device 402 in the component mounting apparatus 401 corresponds to the control device 130 in the component mounting apparatus 101. A Y-directional table 341 of the component mounting apparatus 401 corresponds to the circuit board moving device 140 in the component mounting apparatus 101.

Figure 11:
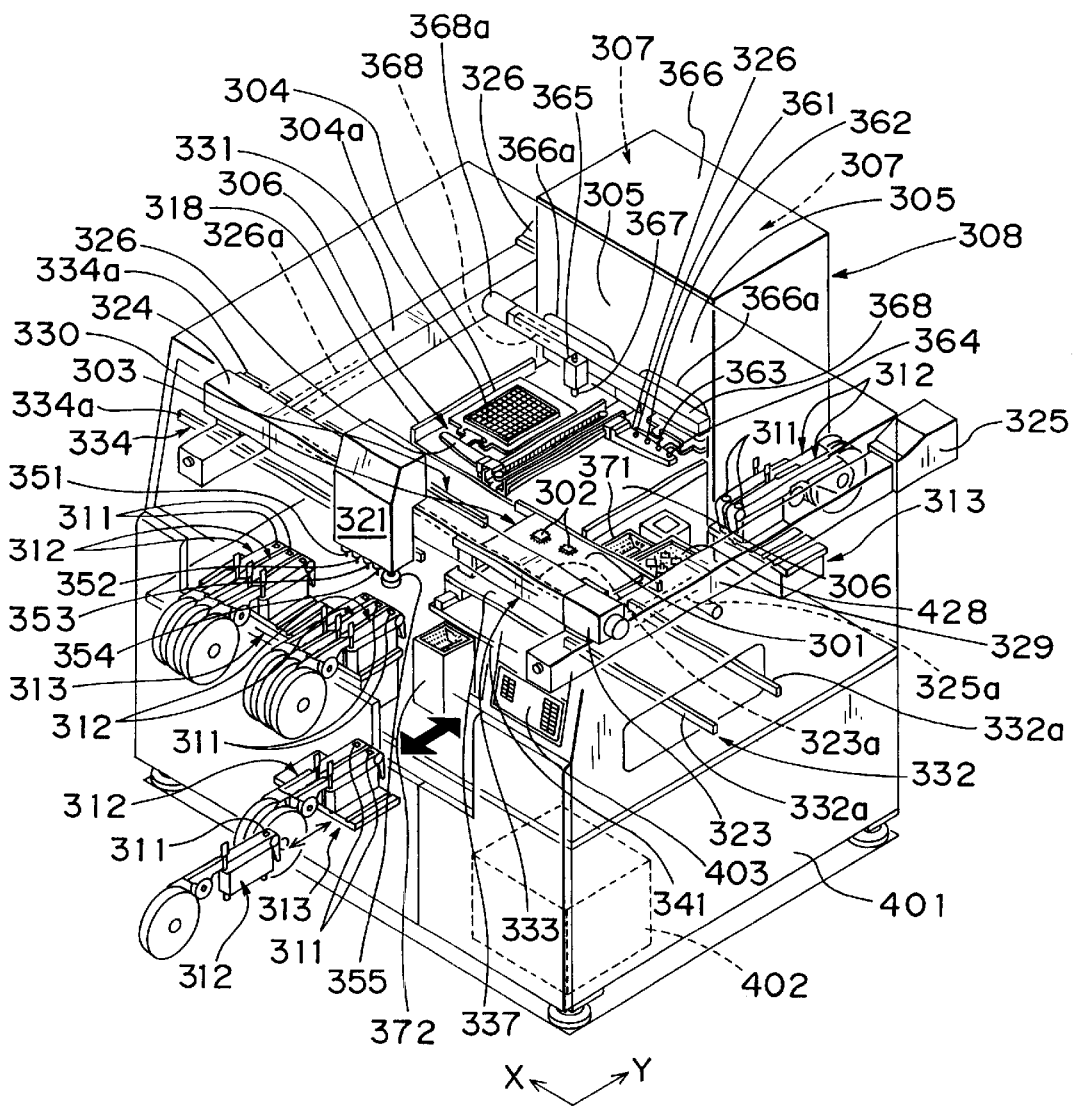
FIG. 11 is a perspective view schematically showing a construction of a component mounting apparatus according to a second embodiment of the present invention.

According to the second embodiment, as shown in FIG. 11, the component mounting apparatus is designed to mount electronic components 302 of various types including connectors, etc. as an example of components to a circuit board 301 as an example of objects to be mounted, thereby producing an electronic circuit board 303. However, the second embodiment is not restricted to this and is applicable to any case where various components are attached to various objects to be attached to assemble or manufacture or produce various products.

Figure 12:
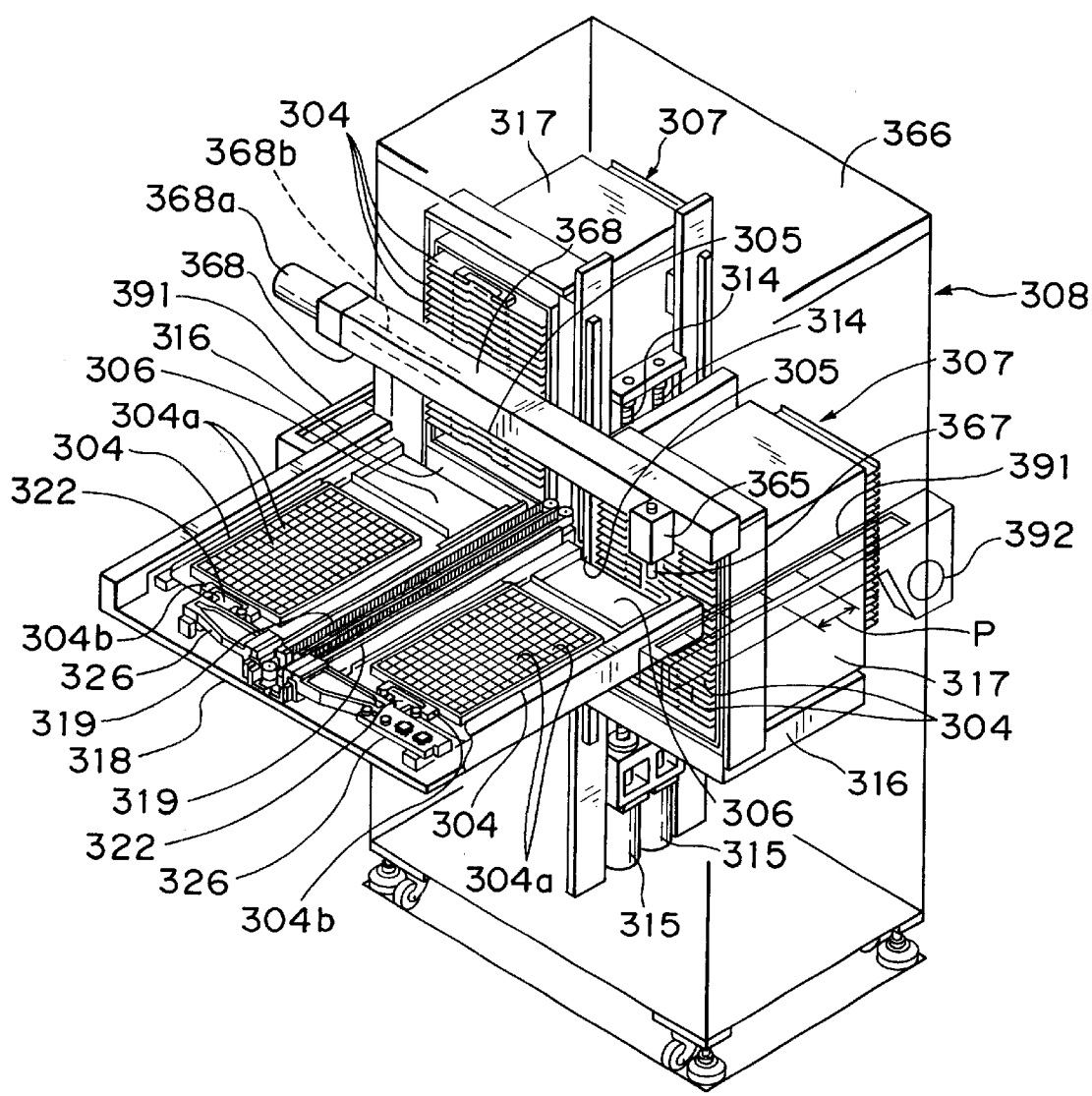
FIG. 12 is a perspective view schematically showing the construction of a tray type component feed part of the apparatus of FIG. 11.

The component mounting apparatus 401 in FIG. 11 has the tray type component feed part 308 and the cassette type component feed part 313. The tray type component feed part 308 includes a plurality of tray type component feed mechanisms 307 arranged side by side as shown in FIG. 12. The tray type component feed mechanisms 307 select a tray 304 storing predetermined components, when various electronic components 302 are dealt with, and move the tray if necessary from a storage position 305 to a component feed position 306, thereby supplying the stored electronic components 302. The cassette type component feed part 313 contains a plurality of component feed cassettes 312 disposed adjacent to each other. The component feed cassette 312 loading taping components or bulk components feeds the electronic components 302 one by one to a component feed position 311.

In the component mounting apparatus 401 of the present embodiment, the electronic components 302 of various kinds supplied from the tray type component feed mechanisms 307 and cassette type component feed part 313 are picked up when necessary, e.g., by the mount head 321 which can move in two, i.e., X, Y-directions orthogonal to each other seen from a plane, thereby being mounted to predetermined positions on the circuit board 301. The electronic circuit board 303 is thus manufactured.

The tray type component feed mechanism 307 has a lift stage 316, which moves up and down by the clockwise and counter-clockwise rotation of a screw shaft 314 by a motor 315, as shown in FIG. 12. A tray magazine 317 storing many trays 304 is placed and positioned at a predetermined position of the lift stage 316, and also locked by a lock member (not shown) not to drop unexpectedly. The tray magazine 317 stores many trays 304 containing various electronic components 302 in many stages so that the trays can be separated up and down by right and left rails (not shown) to be individually taken inside and outside.

An insertion/withdrawal stage 318 for use in moving the trays 304 inside and outside is arranged at the component feed position 306 of the tray magazine 317 set in front of a lift part of the lift stage 316, which is shared by the tray type component feed mechanisms 307. Each of shuttles 326 on the insertion/withdrawal stage 318 is reciprocated by a timing belt 319 running longitudinally a center part of the insertion/withdrawal stage 318, thereby loading, unloading the opposed trays 304 in the tray magazines 317. The tray magazine 317 is controlled by the up and down movement of the lift stage 316 to be disposed at an insertion/withdrawal height where the tray 304 storing the electronic components 302 to be supplied is to be loaded and unloaded on the insert/withdrawal stage 318. Then the tray 304 is drawn out by the shuttle 326 to the component feed position 306 on the insertion/withdrawal stage 318 to feed the predetermined electronic components 302.

When the electronic components 302 stored in an another tray 304 are to be supplied, the previous tray 304 drawn out to the component feed position 306 is pressed back to the original height position of the tray magazine 317. The tray 304 storing the electronic components 302 to be supplied next is taken out in the same manner as above to the component feed position 306 while kept at the above insertion/withdrawal height by controlling a height of the tray magazine 317 by the lift stage 316.

The shuttle 326 is equipped with a coupling member 322 for inserting and withdrawing the trays 304. The coupling member 322 is opened and closed by an actuator (not shown), thereby disengaging and engaging a coupling part 304b of the tray 304, e.g., in insertion/withdrawal directions in which the tray 304 is taken in and out. The shuttle 326, in a state while coupled with the tray 304, places the tray 304 into the tray magazine 317 and takes the tray 304 out of the magazine 317. The shuttle 326 can be separated from the tray 304 when disengaged from the coupling part. The coupling member 322 does not impede the tray 304 from moving subsequent to the up and down movement of the tray magazine 317 and can retreat not to impede the tray.

Recesses 304a are formed in matrix in the tray 304 in conformity with a shape and a size of the electronic components 302 to be stored in the tray 304, enabling the electronic components 302 to be stored in a state in which the electronic components are aligned in a predetermined direction. The tray 304 is accordingly appropriate for flat large electronic components 302 and flat large electronic components 302 of irregular shapes such as connectors, etc. The recesses 304a of the tray 304 hold and position the electronic components 302 in a fixed direction on the tray 304.

On the other hand, the component feed cassette 312 is appropriate for use in handling electronic components, for example, many kinds of minute chip components and the like which are used much more frequently than the electronic components 302 handled by the tray 304. Many component feed cassettes 312 are arranged in parallel in the cassette type component feed part 313 so as to feed many electronic components 302.

The tray type component feed part 308 and the cassette type component feed part 313 can be arranged basically in any layout on condition that the electronic components 302 supplied via the relative movement to the mounting head 321 can be caught by the mount head 321 at every required time to be mounted at a predetermined position on the circuit board 301 through the relative movement to the circuit board 301.

For example, when many kinds of minute electronic components 302 of a high use frequency are dealt at the cassette type component feed part 313, the many kinds of components are sequentially supplied from many component feed cassettes 312, continuously handled by the mounting head 321 by every number conforming to the use frequency and sequentially mounting to the predetermined position on the circuit board 301. In the meantime, electronic components 302 of different kinds are alternately supplied by the plurality of the tray type component feed mechanisms 307 at the tray type component feed part 308. In this construction, although a time for each electronic component 302 to be supplied is long, a time required for sequentially supplying the electronic components 302 of different kinds is reduced in half, and therefore a feed speed for a plurality of kinds of electronic components 302 from the trays 304 is doubled. The plurality of kinds of electronic components 302 can be supplied in time from the trays 304 while the mounting head 321 continuously handles and mounts the electronic components 302 supplied from the cassette type component feed part 313. Since more kinds of electronic components 302 can be handled and a time lag in the supply of electronic components is reduced or eliminated as a whole, a mounting speed for the components is enhanced.

As shown in FIG. 11, the mounting head 321 supported by an X-directional table 324 is reciprocated in the X direction by a normal-reverse rotation of a screw shaft 323a by a motor 323. Both end parts of the X-directional table 324 are supported by Y-directional tables 329, 331 and reciprocated in the Y direction through the normal-reverse rotation of screw shafts 325a, 326a by synchronously driven motors 325, 326 of the Y-directional tables 329, 331. On the other hand, the circuit board 301 is transferred in the X direction to be made available for the mounting of the electronic components by the mounting head 321. More specifically, the circuit board 301 is carried to a component mounting position 333 via the loading part 332 having a pair of transfer rails 332a, where the components are mounted to the circuit board. The electronic circuit board 303 at the component mounting position 333 after the components are mounted thereto is sent out via the unloading part 334 having a pair of transfer rails 334a. A transfer path 330 is constructed for the circuit board 301 and the electronic circuit board 303 as a whole.

Figure 13:
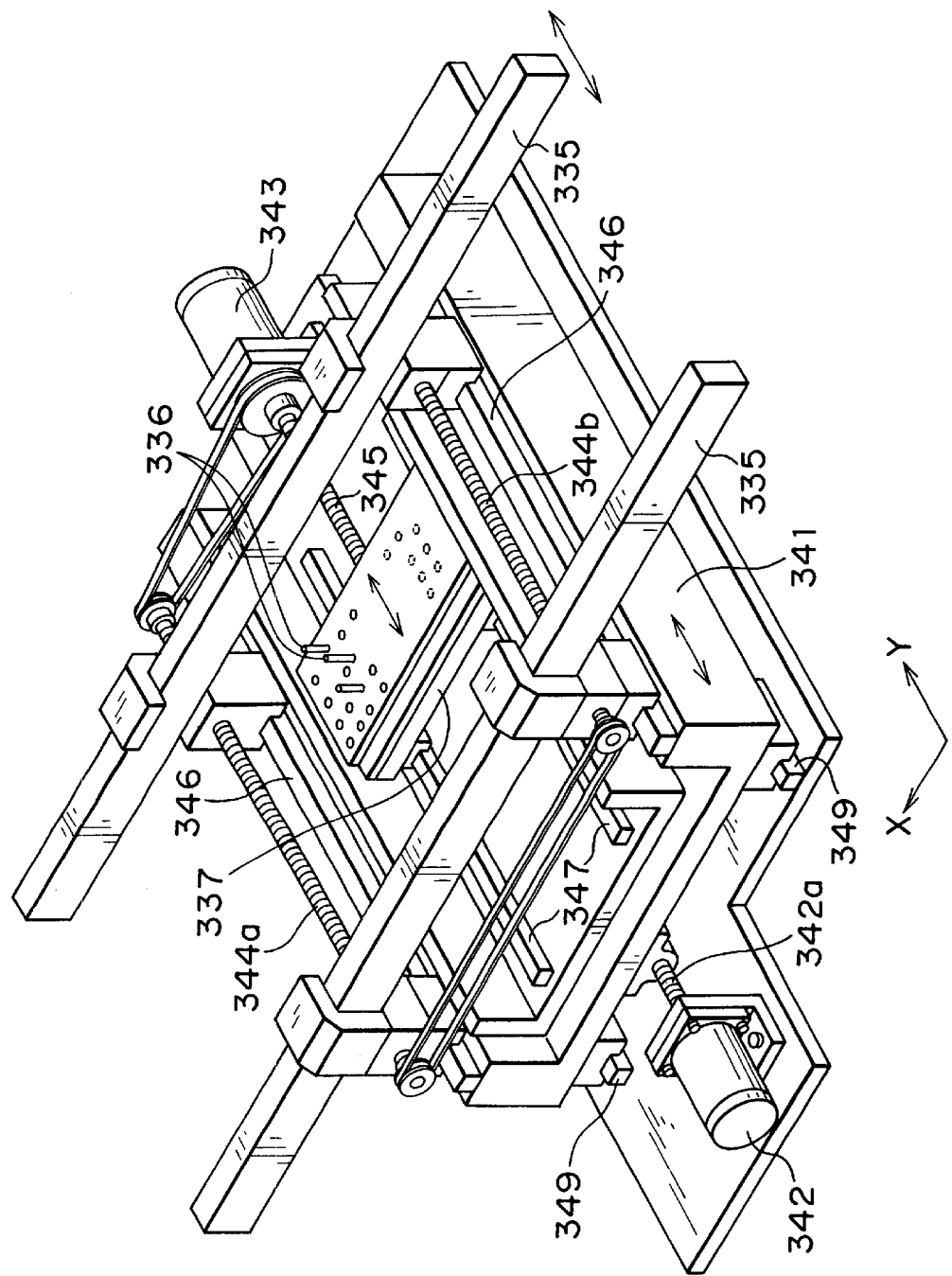
FIG. 13 is a perspective view of the construction of the entire apparatus of FIG. 11 including a Y-directional move mechanism for a positioning support stage.

Referring to FIGS. 11 and 13, at the component mounting position 333 are arranged a pair of transfer rails 335 for carrying in the circuit board 301 and carrying out the electronic circuit board 303, and a positioning support stage 337. The positioning support stage 337 supports the carried circuit board 301 from below between the pair of the transfer rails 335, for instance, supports the double-face circuit board 301 by means of support pins 336 or the like, and positions the same. At this time, the support pins 336 support the circuit board 301 not to interfere with the electronic components 302 mounted at a downside support face of the circuit board 301.

The tray type component feed part 308 and the cassette type component feed part 313 are separated opposite to each other at one side and the other side of the transfer path 330 for the circuit board 301 and electronic circuit board 303 as is shown in FIG. 11. Because of this arrangement, a length in the X direction of each of the tray type component feed mechanisms 307 and the component feed cassettes 312 placed side by side is reduced to half. However, the arrangement can be freely determined, Actually another cassette type feed part 313 in which some component feed cassettes 312 are arranged in the X direction is placed next to the tray type component feed part 308 in the present embodiment. Although the number of arrays of the component feed cassettes 312 is thus increased, the component feed part as a whole is made almost equal in length in the X direction at both sides of the transfer path 330, and the transfer path 330 of the entire apparatus can be an effective space contributing to the supply of components.

Needless to say, the number of the adjacent tray type component feed mechanisms 307 at the tray type component feed part 308, the number of the tray type component feed parts 308, the number of the adjacent component feed cassettes 312 at the cassette type component feed part 313 and the number of cassette type component feed parts 313 as well as respective locations are freely selectable and can be designed in various manners.

In the arrangement according to the embodiment in which the component feed parts 308, 313 are separately arranged at both sides of the transfer path 330, the mounting head 321 sometimes needs to move astride the transfer path 330 in the Y direction depending on a pick-up order for the electronic components 302 supplied from the tray type component feed part 308 and cassette type component feed part 313 in order to pick up the electronic components 302. A movement distance of the mounting head 321 in this case becomes larger than when the mounting head 321 moves without passing the transfer path 330, leading to an increase of a time required for picking up and mounting the electronic components 302 to the circuit board 301. The variation in the time limits a mounting order for the electronic components 302 of various kinds in view of an operation efficiency for mounting the various kinds of electronic components 302 in order.

For solving the inconvenience, according to the present embodiment, the component mounting position 333 is rendered movable in the Y direction. Specifically, the pair of transfer rails 335 and the positioning support stage 337 at the component mounting position 333 are placed on the Y-directional table 341 as shown in FIG. 13 and the Y-directional table 341 is reciprocated along guide rails 349 in the Y direction through the normal-reverse rotation of a screw shaft 342a by a motor 342. In addition, when the mounting head 321 moves passing over the transfer path 330 to the component feed part 308 or component feed part 313 so as to catch the electronic components 302 as plotted by a solid line in FIG. 15. More specifically, for example, when the mounting head 321 moves from above the circuit board 301 to the cassette type component feed part 313 or at the like occasion, such an operation described below is carried out.

Figure 15:
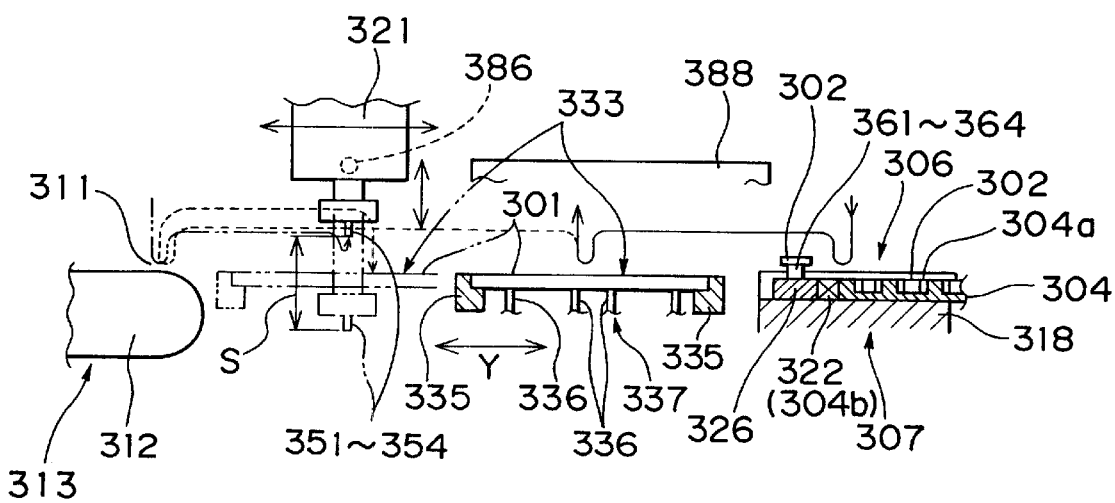
FIG. 15 is an explanatory diagram of a positional relationship of the positioning support stage of FIG. 13, a cassette type component feed part and the tray type component feed part at both sides of the positioning support stage, and a mounting head.

The positioning support stage 337, and thus, the component mounting position 333, is moved such as the circuit board 301 represented by a phantom line in FIG. 15, either simultaneously with the mounting head 321 as it moves to the component feed part 308, or 313, arranged at the side to which the mounting head 321 moves, or at least before the mounting head 321 starts to mount the next electronic component 302. The movement distance of the mounting head 321 to mount the picked electronic components 302 to the predetermined position on the circuit board 301 is shortened accordingly.

A difference in required times for the electronic components 302 to be mounted to the predetermined position on the circuit board 301 after being picked up is made small between when the mounting head 321 sequentially picks up and mounts the electronic components 302 of various kinds without passing over the transfer path 330 and when the mounting head sequentially picks up and mounts the electronic components 302 of various kinds passing over the transfer path 330. Therefore, whether the mounting head 321 moves over the transfer path 330 to sequentially mount the electronic components 302 of various kinds to the predetermined position on the circuit board 301, the operation efficiency is not particularly deteriorated. This is true even without the mounting order for the electronic components 302 taken into account. Therefore the high-speed mounting is readily met.

If the mounting head 321 moves astride the transfer path 330, the positioning support stage 337 follows the movement of the mounting head with the utilization of time after the mounting head 321 picks up the electronic component 302 before the mounting head mounts the component to the circuit board 301. That is, a special time for moving the positioning support stage 337 is not required. Therefore, the movement of the following positioning support stage does not interfere with the high-speed mounting.

The pair of transfer rails 335 are supported on the Y-directional table 341. One rail is fixed and the other rail is supported to be movable along Y-direction guide rails 346. A distance between the transfer rails is adjusted to increase or decrease by the normal-reverse simultaneous rotation of screw shafts 344a, 344b by a motor 243 via a belt and a pulley to agree with a breadth of the circuit board 301 in the perpendicular direction to the transfer direction. Concurrently with this, the positioning support stage 337 is reciprocated at ½ a speed of the movable transfer rail 335 in parallel to Y-directional guide rails 347 by the normal-reverse rotation of a screw shaft 345 directly coupled to the motor 343. The positioning support stage 337 is always kept at a predetermined position, e.g., at a center position between the pair of transfer rails 335. Accordingly, the positioning support stage supports and positions the circuit board 301 received between the pair of transfer rails 335 from below in a state while centering the circuit board 301.

The mounting head 321 has a plurality of component mounting tools 351–354 for mounting the components aligned in the X direction, i.e., arrangement direction of the component feed cassettes 312 and tray type component feed mechanisms 307, and a recognition camera 355 for recognizing a position on the circuit board 301 where each electronic component 302 caught by the component mounting tool 351–354 is mounted. The mounting tools and the recognition camera 355 are maintained in a positional relationship of a row. Each component mounting tool 351–354 corresponding to the component holding member conforms to types of the electronic components 302 handled thereby, which can be a suction nozzle for sucking thereby holding the electronic components 302, a chuck for chucking the electronic components 302, or the like. The component mounting tools in the embodiment are suction nozzles.

In association with the mounting head 321, the shuttles 326 at the tray type component feed mechanisms 307 are reciprocated to select the trays 304 and move the trays from the storage position 305 to the component feed position 306 and store the trays to the storage position 305. At least one of the shuttles 326 has component holding parts 361–364 for holding the electronic components 302. The component holding parts are arranged in a direction and with a pitch corresponding to an arrangement direction and an arrangement pitch of the component mounting tools 351–354. A component transfer head 365 included in the tray type component feed mechanisms 307 picks up the electronic component 302 stored in the tray 304 moved to the component feed position 306 of the tray type component feed mechanism 307, and conveys the electronic component to the component holding part 361–364. The mounting head 321 picks up also the electronic components 302 held at the component holding parts 361–364 and mounts the components to the predetermined positions on the circuit board 301.

The component holding parts 361–364 conform to kinds of electronic components 302 handled thereby, and can be anything so long as the electronic components 302 held thereby can be picked up by the component mounting tools 351–354 of the mounting head 321. Specifically, suction nozzles are the component holding parts in the embodiment, which fit flat electronic components 102 to be handled in a state while stored in the trays 304. The component transfer head 365 alike has a component transfer tool 367 conforming to a type of electronic components 302 handled thereby. A suction nozzle is used as the component transfer tool which is appropriate to flat electronic components 302 to be handled while kept in the trays 304.

The component transfer head 365 is supported by an X table 368 secured immediately above a part of a cabinet 366 where openings 366a through which the trays 304 are loaded, unloaded by the shuttles 326 are formed. The cabinet 366 covers the whole of the tray type component feed mechanisms 307 at the tray type component feed part 308. The component transfer head 365 is reciprocated in parallel to the X table 368 by the normal-reverse rotation of a screw shaft 368b by a motor 368a. A range of the reciprocation allows the component transfer head 365 to traverse both component feed positions 306 of the adjacent tray type component feed mechanisms 307. The component transfer head 365 utilizes the movement of each tray 304 by the shuttle 326 in the insertion/withdrawal directions as well to pick up the electronic component 302 from each tray 304 and transfer the picked electronic component 302 to the component holding part 361–364. Therefore, the electronic components 302 at any position in the tray 304 can be picked up and transferred to any of the component holding parts 361–364. Naturally, the transfer head 365 may be adapted to move in the X, Y two directions.

An operation as follows is enabled in the above-described construction for a time while the mounting head 321 continuously handles the electronic components 302 of the number according to a use frequency which are supplied from the cassette type component feed part 313. With the plurality of adjacent tray type component feed mechanisms 307 being driven to supply the electronic components 302 of different kinds, if a time allowance remains before the electronic components 302 in the tray 304 are used next, the time is utilized for the component transfer head 365 to catch the electronic components 302 from the tray 304 rendered in a component feed state and transfer the electronic components 302 of a predetermined number to the plurality of component holding parts 361–364 of one shuttle 326 which move trays 304 at the tray type component feed mechanism 307. The predetermined number of transferred electronic components 302 are picked up and mounted simultaneously together when necessary by the component mounting tools 351–354 of the mounting head 321, agreeing in arrangement direction and arrangement pitch with the component holding parts. Including the case where a part of the component mounting tools 351–354 directly picks up the electronic components 302 from the trays 304 located at the component feed position 306, a mount efficiency for the electronic components 302 supplied by the tray type component feed part 308 is improved by a number equal to a multiple of the number of the simultaneous pick-up of the electronic components 302, and the mounting speed is increased remarkably. The component holding parts 361–364 are preferably prepared by the same number as that of the component mounting tools 351–354 of the mounting head 321 as in the present embodiment.

The way of handling the plurality of electronic components 302 at one time with the use of the mounting head 321 utilizing the component holding parts 361–364 is effective to produce a so-called split circuit board such that after the electronic components 302 are mounted to a plurality of circuit boards 301 united with each other, the circuit boards 301 are divided to individual electronic circuit boards 303. Particularly, the way is useful when the same electronic components 302 are simultaneously mounted to the united body of the plurality of circuit boards 301. Also, a plurality of the same electronic components 302 can be supplied from the cassette type component feed part 313 and mounted at one time to the united body of the plurality of circuit boards 301. In this case, it is necessary to make an arrangement pitch of the component feed cassettes 312 at the cassette type component feed part 313 simultaneously supplying the same electronic components 302 equal to the arrangement pitch of the plurality of component mounting tools 351–354 of the mounting head 321 which pick up the electronic components 302 simultaneously.

In the embodiment, when the trays 304 are maintained at the storage position 305 by the shuttle 326 at the right tray type component feed mechanism 3 07 having the component holding parts 361–364 as shown in FIG. 11, whereas the tray 304 is drawn out to the component feed position 306 by the shuttle 326 at the left tray type component feed mechanism 307, the electronic components 302 stored in the left tray 304 taken out to the component feed position 306 can be delivered to the component holding parts 361–364 of the shuttle 326 holding the right tray 304 at the storage position.

The plurality of electronic components 302 can be handled together by the mounting head 321 easily and efficiently in terms of time. The component holding parts 361–364 may be placed at both the right and the left shuttles 326 to be selectively used. In this case opposite to the above case, while the trays 304 are stored at the storage position 305 by the left shuttle 326, the electronic components 302 stored in the right tray 304 taken out to the component feed position 306 are handed over to the component holding parts 361–364 of the left shuttle 226, go that the mounting head 321 can handle the electronic components at once. This is effective to handle all the electronic components 302 sequentially for each of various types at once.

As in FIG. 12, irrespective of the presence/absence of the component holding parts 361–364 at the shuttles 326 of the tray type component feed mechanisms 307, the mounting head 321 can continuously catch every predetermined number of the electronic components 302 from both trays 304 drawn out from the right and left tray type component feed mechanisms 307, and can mount the electronic components together to the predetermined positions on the circuit board 301. At this time, the electronic components 302 picked up from both, or either, of the right and left trays 304 and the electronic components 302 picked up from the component holding parts 361–364 can be handled together in mixture to be mounted simultaneously to the predetermined positions of the circuit board 301.

In the present embodiment, since the electronic components 302 are kept in the fixed direction in the trays 304, the electronic components 302 picked up from the trays 304 by the component transfer tools 351–354 are preliminary rotated to a direction corresponding to the mounting direction by the mounting head 321 to the circuit board 301 before being caught at the component holding parts.

Consequently, while the mounting head 321 mounts the electronic components 302 supplied from the cassette type component feed part 308, the electronic components 302 can be rotated interlockingly with the feed operation at the tray type component feed part 308 without any special time. A time consumed for recognizing the image of each electronic component 302 after being caught by the mounting head 121 and for rotating the electronic component in a predetermined direction is eliminated, so that the electronic component can be mounted immediately after being caught. Accordingly, the mounting speed is further enhanced.

To cope with the electronic components 320 supplied from the component feed parts 308, 313 at both sides of the transfer path 330 to be mounted by the mounting head 321 onto the predetermined positions on the circuit board 301 positioned at a predetermined position on the transfer path 330, recognition cameras 371, 372 are installed at both end positions of a range where the positioning support stage 337 of the transfer path 330 moves in the Y direction. The recognition camera, either 371 or 372, disposed in the halfway of a path where the mounting head 321 catches the supplied electronic components 302 and moves the components to above the circuit board 301, recognizes images of positions and directions of the electronic components 302 held by the component mounting tools 351–354 of the mounting head 321, determines the movement distance of the mounting head necessary for mounting the recognized electronic components 302 to the predetermined positions on the circuit board 301, and also determines correction amounts in direction of the held electronic components 302. After the direction of the electronic components 302 is rotated by the determined correction amounts through the rotation of the component mounting tools 351–354 holding the electronic components 302, the electronic components are mounted to the predetermined position on the circuit board 301.

Since a wasteful reciprocating movement of the mounting head 321 to make the electronic component 302 held by each component mounting tool 351–354 of the mounting head 321 recognized is eliminated as above, the high-speed mounting is not hindered.

When the electronic components 302 held by the component mounting tools 351–354 of the mounting head 321 are corrected in direction and ate mounted to the predetermined positions on the circuit board 301, the recognition camera 355 attached at the mounting head 321 recognizes a position of the entire circuit board 301 and the component mounting position on the circuit board 301. Specifically, according to the embodiment, when the electronic components 302 are to be caught from the component feed part 308 or 313 at the side beyond the transfer path 330 of the mounting head 321 and then mounted, the positioning support stage 337 is moved in the Y direction to the component feed part 308 or 313 from which the components are to be caught.

That is, the positioning support stage 337 is moved in an opposite direction to the previous movement direction eventually to reach the predetermined position immediately before the electronic components 302 are mounted. However, the positioning support stage 337 probably fails to reach the predetermined position correctly because of influences of a backlash or the like of driving mechanisms or control errors, and the component mounting position tends to be displaced if based on the position of the entire circuit board 301 or component mounting position on the circuit board 301 recognized by the recognition camera 355 of the mounting head 321.

Figure 14:
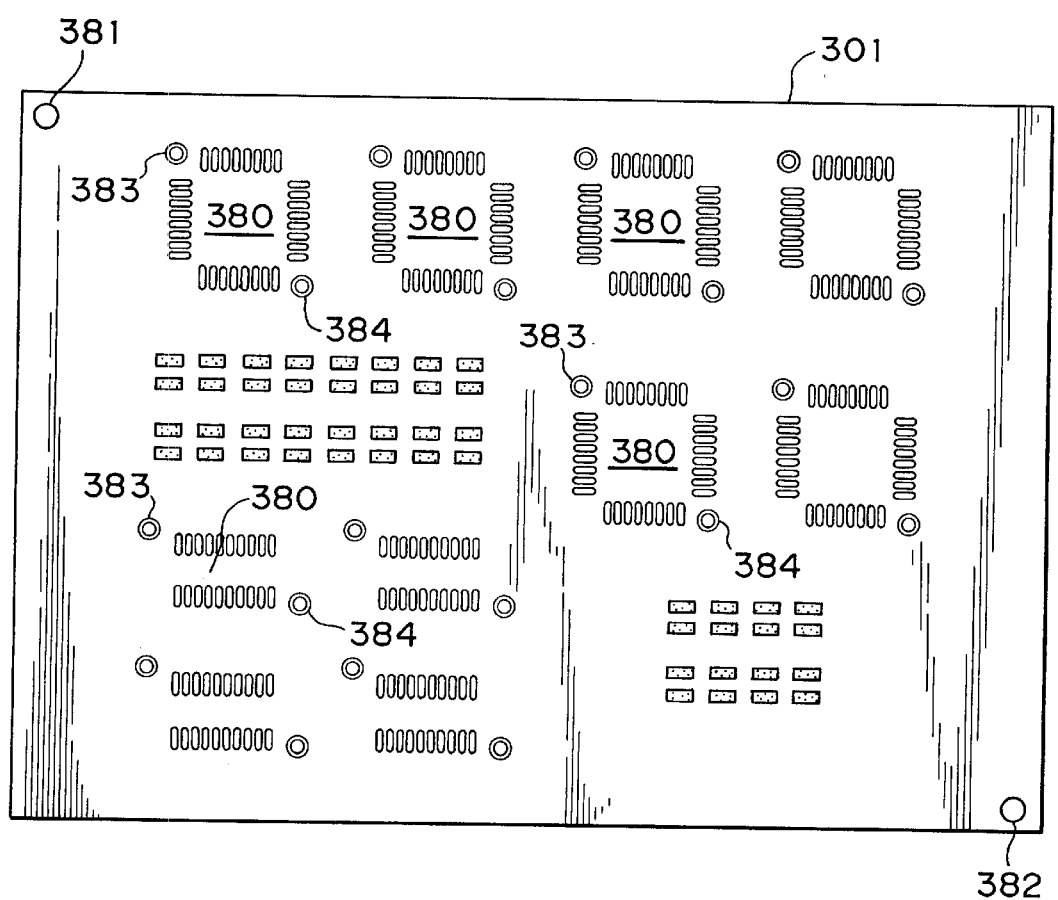
FIG. 14 is a plan view of an example of a circuit board to which electronic components are to be mounted.

In order to avoid the problem in the embodiment, every time the positioning support stage 337 moves and stops at the component feed part 308 or 313 where the electronic components 302 are to be picked up by the movement of the mounting head 321 astride the transfer path 330, the recognition camera 355 of the mounting head 321 recognizes a total position of the circuitboard 301 from total position marks 381, 382 shown in FIG. 14. Moreover the recognition camera 955 of the mounting head recognizes a mounting position 380 of each electronic component 302 on the circuit board 301 from mounting position marks 383, 384. Based on the recognition results, the electronic components 302 caught by the mounting head 321 from the component feed part 308 or 313 through the movement astride the transfer path 330 are mounted to the predetermined positions of the circuit board 301 placed on the positioning support stage 337, which moves to stop at the predetermined position at the side where the component feed part 308 or 313 is located. Therefore, the positioning support stage 337, moves in the direction opposite to the previous movement direction immediately before the electronic components 302 are mounted. Consequently, if a variation in stop position caused by the backlash of the driving mechanisms or the control errors occurs, the electronic components can be mounted correctly to the predetermined position on the circuitboard 301 without influences of the variation in stop position.

Figure 16:
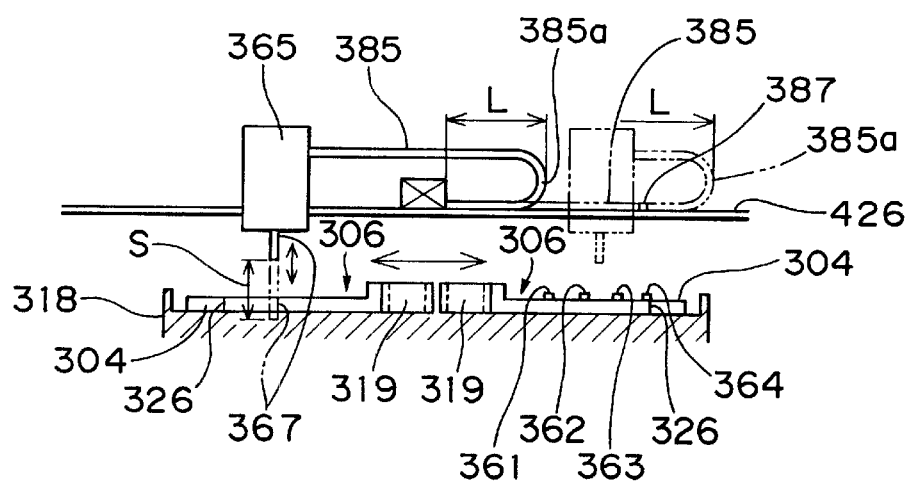
FIG. 16 is an explanatory diagram of a positional relationship of trays at each of component feed positions of tray type component feed mechanisms arranged adjacent to each other, and a component transfer head.

A downward stroke S of a size that interferes with the circuit board 301, tray 304, etc. as objects is provided for any of the component mounting tools 351–354 of the mounting head 321 and the component transfer tool 367 of the component transfer head 365, as shown in FIGS. 15 and 16, to surely catch, mount and transfer the electronic components 302. In the presence of the downward stroke, while the component mounting tools 351–354 are in a descended state, if one or both of the mounting head 321 and the positioning support stage 337 move to approach each other, or one or both of the component transfer head 365 and the tray 304 move to be close to each other, these interfere with each other and are broken.

An operation program for the control device should be designed to prevent the interference.

However, the software alone cannot prevent the interference and failures are possibly brought about by noises or some other reason.

In the present embodiment, an area sensor 386 as indicated in FIG. 15 is provided for preventing the interference of the mounting head 321 and positioning support stage 337. An area sensor 387 as shown in FIG. 16 is employed for preventing the interference between the component transfer head 365 and tray 304 or the shuttle 326.

The area sensor 386 detects whether at least one of the component mounting tools 351–354 of the mounting head 321 is in a positional range to face above the circuit board 301 on the positioning support stage 337. A photosensor is used by way of example of the area sensor. The area sensor 386 is attached to, e.g., the mounting head 321, and a light-shielding plate 388 of a length corresponding to a size of a maximum circuit board 301 in the Y direction is placed at the positioning support stage 337. The light-shielding plate is moved together with the circuit board 301. The positioning support stage 337 is allowed to move only for a time when the area sensor 386 detects the light-shielding plate 388.

Hardware, i.e., the area sensor 386 in any case including the control error or malfunction, etc., detects whether the mounting head 321 is out of a component mounting range on the positioning support stage 337, whereby the positioning support stage 337 is prohibited from moving. The interference phenomenon is thereby avoided between the positioning support stage and the mounting head when the positioning support stage 337 moves towards the mounting head 321 in a state while the mounting head 321 is present outside the component mounting range on the positioning support stage 337 with the component mounting tools 351–354 kept in the descended state. Additionally, since the light-shielding plate 388 is formed to conform to the circuit board 301 of a maximum size, any problem is prevented even if the circuit board 301 is changed in size. The light-shielding plate 388 is, or may be, adjusted in length in association with the distance adjustment operation for the transfer rails 335 carried out to meet the size of the circuit board 301. Alternatively the light-shielding plate itself may be exchanged. The area sensor 386 may be constituted in any other form than a combination of the photosensor and the light-shielding plate, and any hardware means exerting the same function is adoptable as the area sensor 386.

The component mounting operation is executed by descending the mounting tools 351–354 from the mounting head 321. In a range where the area sensor 386 does not detect the light-shielding plate 388, the component mounting tools 351–354 of the mounting head 321 are prevented from moving down to mount the electronic components. Moreover, when at least one of the component mounting tools 351–354 is at a descended position with the area sensor 386 not detecting the light-shielding plate 388, the positioning support stage 337 is refrained from moving in the Y direction.

The area sensor 387 detects whether the component transfer head 365 is present at a position to interfere with any one of the trays 304 of the tray type component feed mechanisms 307. A photosensor is used by way of example of the area sensor in the embodiment. A fold part 385a of an air piping 385 connected to the suction nozzle which is the component transfer tool 367 of the component transfer head 365 interlocks with the movement of the component transfer head 165 at ½ a speed thereof, thereby changing a length L of the air piping 385 running on a piping guide 426. With the utilization of this length change, the area sensor 387 is attached to a fixed part of the piping guide 426, or the like, and detects a position at which of the tray type component feed mechanisms 307 the component transfer head 365 is present on a basis of a length range of the piping 385 running on the piping guide 426.

Specifically, while the area sensor 387 detects the air piping 385 as indicated by a phantom line in FIG. 16, the component transfer head 365 is judged to be present at the right tray type component feed mechanism 307 of FIG. 16, thereby prohibiting the trays 304 at the right tray type component feed mechanism 307 from moving, but permitting the component transfer tool 367 to descend. The component transfer head 365 is prohibited from moving to the left tray type component feed mechanism 307 in the descended state of the component transfer tool 367. At the same time, the tray 4 of the left tray type component feed mechanism 307 is permitted to be moved inside, outside.

While the area sensor 387 does not detect the air piping 385 as represented by a solid line in FIG. 16, the component transfer head 365 is judged to be at the side of the left tray type component feed mechanism 307 of FIG. 16, whereby the tray 304 in the left tray type component feed mechanism 307 is prohibited from being brought in or out, whereas the component transfer tool 367 is allowed to descend. However, the component transfer head 365 is prohibited from moving to the right tray type component feed mechanism 307 in the descended state of the component transfer tool 367. At the same time, the tray 304 at the right tray type component feed mechanism 307 is permitted to be taken in or out. The area sensor 387 can be any hardware means that function in a similar way, other than the photosensor. When the area sensor 387 is fitted at the fixed part, an electric wiring for the detection can be fixedly and simply arranged in comparison with a case where the electric wiring is not fixed at the fixed part and made movable.

As described hereinabove, an interference operation range of the mounting head 321 and positioning support stage 337, and an interference operation range of the component transfer head 321 and tray 304, or shuttle 326, are detected and dealt with by the hardware means. Irrespective of a software control program, or an actual control based on the program, an interference condition is judged from a positional relationship of the actual movement, thereby surely preventing the interference. Preferably, both the interference prevention by the hardware means and the interference prevention by the software, referred to above, are used in combination.

According to this embodiment, further, if the electronic component 302 is wrong, e.g. a mounting failure or containing a problem, the problem component is discharged, for example, onto a problem component disposing conveyor 391 arranged at a predetermined position, e.g., at both sides of the cabinet 366 of the tray type component feed part 308 shown in FIG. 12. Every time the conveyor 391 receives the extracted problem component, the problem component disposing conveyor is driven intermittently by a predetermined amount by a motor 392 to transfer the received component in a constant direction with every constant pitch P to mount again or discard the component, etc. When the received problem component is larger than a standard, the transfer amount of the conveyor 391 is increased to an integral multiple (P×n) in accordance with a size of the component.

When the mounting head 321 sequentially picks up and mounts supplied electronic components 302 of various kinds to the circuit board 301, if a mounting failure occurs or if there is a component having a problem, the problem component is discharged on the problem component disposing conveyor 391 at the predetermined position and transferred by every constant pitch P, so that a space for receiving a next electronic component 302 is secured. The problem electronic component 302 on the problem component disposing conveyor 391 is dealt with in accordance with a state thereof, for example, to be recycled or discarded manually, etc, Even when the electronic components 302 handled by the mounting head 321 differ in size, the problem component disposing conveyor 391 is intermittently sent by the motor 392 by every movement amount (P×n) in conformity with the size of the electronic components 302 discharged on the conveyor 391, thereby preventing the discharged electronic components 302 from overlapping with each other and interfering with each other or slipping down. Furthermore, the problem component disposing conveyor 391 is prevented from moving more than required by setting the transfer amount of the conveyor to the minimum P in the case of the problem components of a small shape. A worker is hence prevented from missing a chance to process the problem electronic component 302 because of an excessive transfer amount of the problem component disposing conveyor 391.

A tool stocker 428 is installed at a part of the movement range of the mounting head 321, where component mounting tools of various types are stocked so as to be replaced with the component mounting tools 351–354. Therefore, electronic components 302 of various kinds can be handled properly. If necessary, a similar arrangement may be provided for the replacement with the component transfer tool 361.

Figure 17:
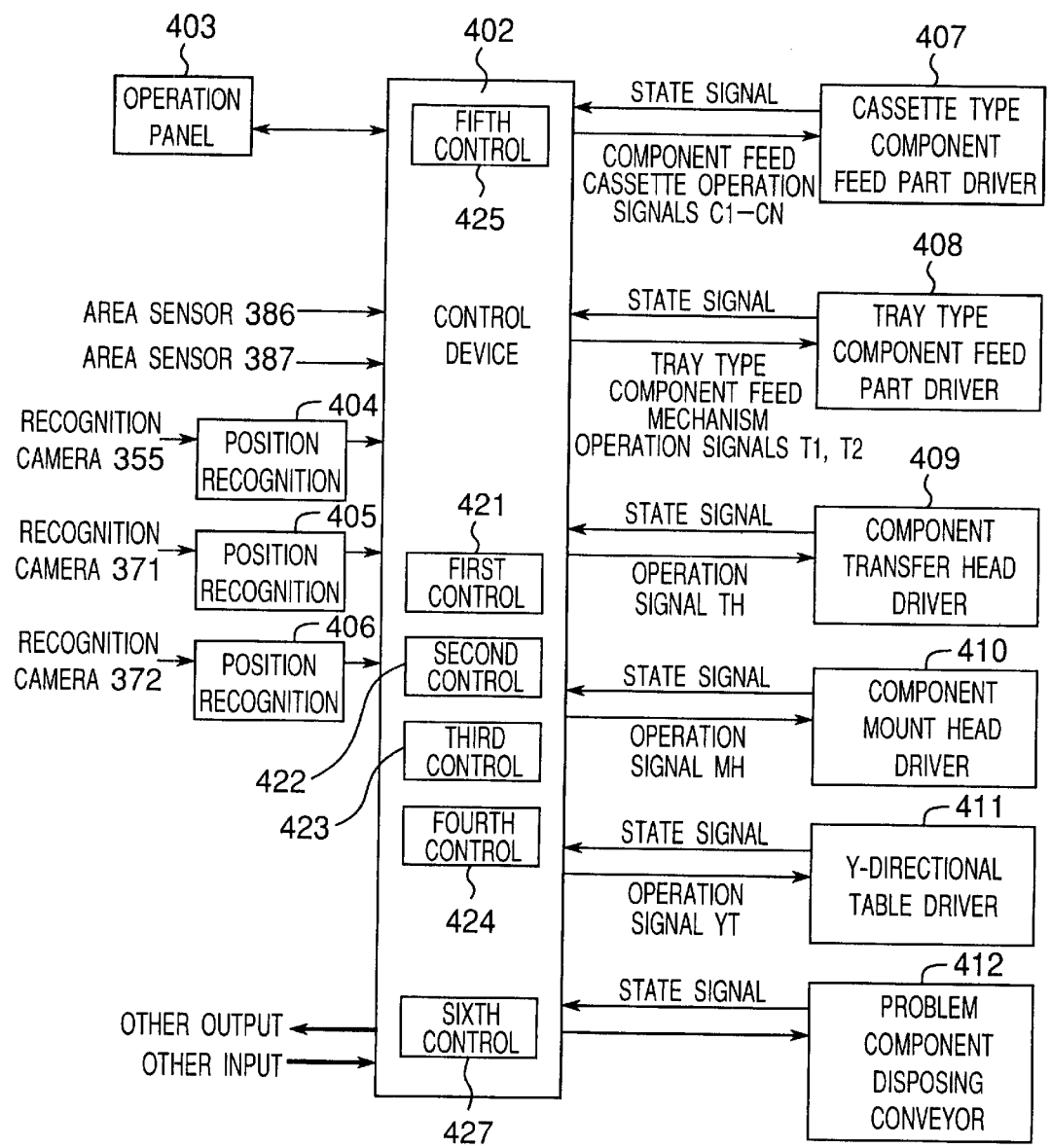
FIG. 17 is a block diagram of a control device of the component mounting apparatus of FIG. 11.
Figure 18:
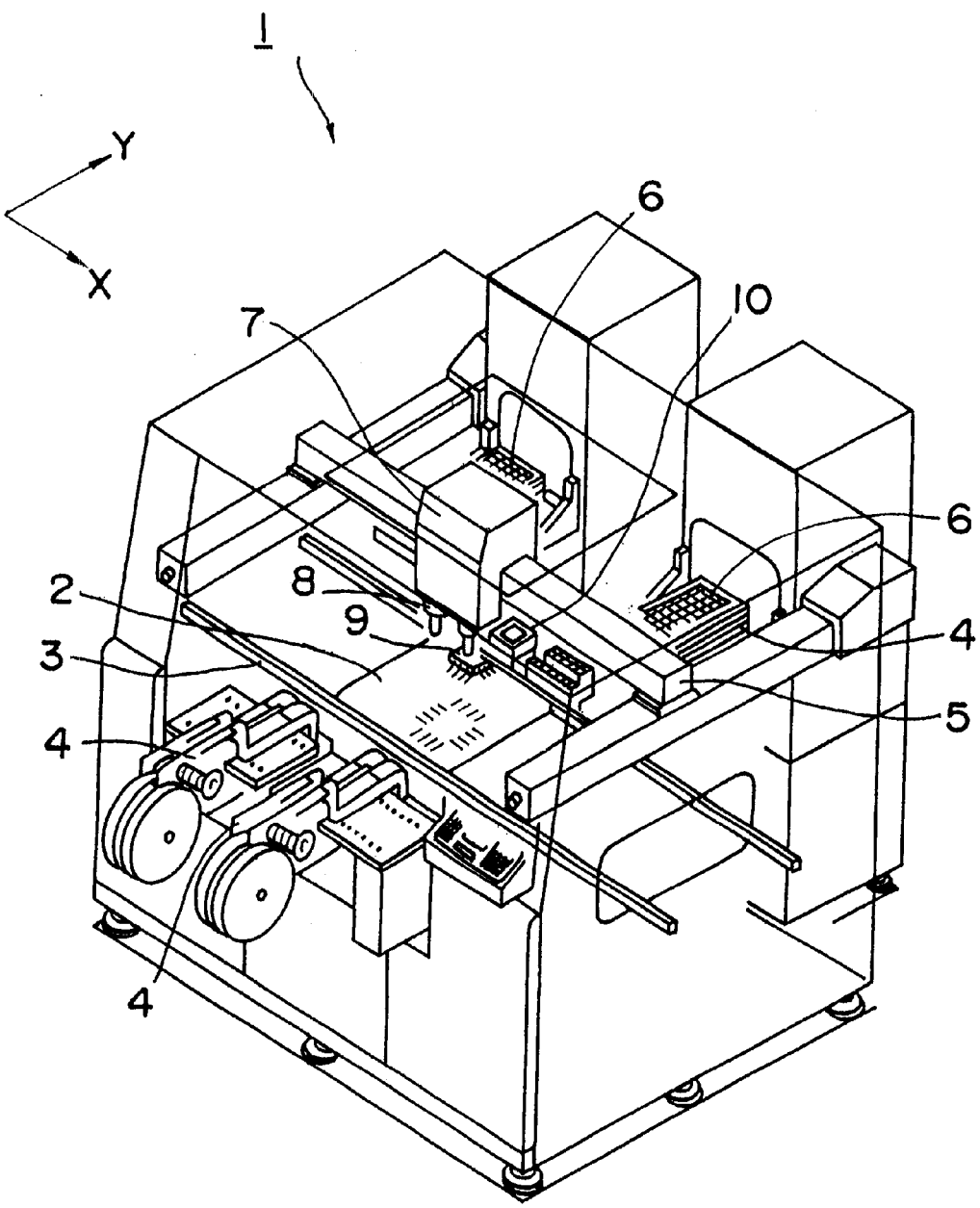
FIG. 18 is a perspective view of a conventional component mounting apparatus.

Control for the above-discussed operation is carried out by the control device 402 installed in the apparatus main body 401 of FIG. 11. The control device 402 is preferably one that utilizes a microcomputer, but not limited to this. For the operation control as above, an operation panel 403 of the apparatus 401 is connected to input and output ports, as indicated in FIG. 17. Recognition circuits 404–406 for obtaining positional information necessary to process input images from each of the area sensors 382, 383 and recognition cameras 355, 371, 372 are additionally connected to the input port. A driver 407 for controlling operation of the cassette type component feed part 313, a driver 408 for the tray type component feed part 308, a driver 409 for the component transfer head 365, a driver 410 for the component mount head 321, a driver 411 for the Y-directional table 341, and a driver 412 for the problem component disposing conveyor 391 are all connected to the output of the control device. The control device is constructed so that each signal indicating an operation state of each object to be controlled is input in real time.

The operation of the aforementioned problem component disposing conveyor 391 is controlled by a sixth control means 427, which is an internal function of the control device 402. A restricted operation of the trays 304 are controlled in operation by the area sensor 386, which is carried out by a first control means 421 as an internal function of the control device 402. Restricted operations of the trays 304 and the component mounting head 321 based on an operation state of the component mounting tools 351–354 input to the control device 402 and the area sensor 386, are conducted by a second control means 422 as an internal function of the control device 402. A restricted operation of the trays 304 by the area sensor 387 is carried out by a third control means 423 as an internal function of the control device 402. Restricted operations of the trays 304 and the component transfer head 365 based on the area sensor 387 and an operation state input to the control device 402 are conducted by a fourth control means 424 as an internal function of the control device 402. In each of the tray component feed mechanisms 307 as mentioned above, a first component feed mode wherein each of selected trays 304 is simultaneously moved to the component feed position 306 as shown in FIG. 12 to provide the electronic components 302 stored therein, and a second component feed mode wherein the electronic components 302 stored in the tray 304 at the component feed position 305 of the tray component feed mechanism 307 are transferred by the component transfer head 365 to the component hold parts 361–364 of the same shuttle 326, are executed by a fifth control means 425 as an internal function of the control device 402 in accordance with a component mounting program in association with the supply of the electronic components 302 at the cassette type component feed part 313 at various timings when necessary.

At this time, only one or both of the feed modes are carried out. Moreover, in the second component feed mode, based on information showing that the electronic components 302 are completely transferred to each of the component hold parts 361–364 or required component hold parts 361–364 the transferred electronic components 302 are picked up all at once and then mounted by the component mounting head 321. In the second component feed mode, alternatively, the supply of the electronic components 302 by the cassette type component feed part 313 may be controlled to continue until a signal showing completion of the transfer of the electronic components 302 is received.

In the first component feed mode, the electronic components 302 of kinds of the number corresponding to the number of the tray type component feed mechanisms 307 can be concurrently or sequentially supplied at maximum. Thus, a feed efficiency for the electronic components 302 of the plurality of kinds by the tray type component feed mechanisms 307 is improved. In the second component feed mode, on t he other hand, the plurality of electronic components 302 held at the component hold parts 361–364 of the shuttle 326 can be picked together by the component mounting tools 351–354, or the like, of the component mounting head 321 that has the arrangement direction and pitch with the held electronic components at the hold parts 361–364. As such, the number of operation procedures and a necessary time for catching the electronic components 302 can be reduced. Bemideg, if the sectoring components 302, etc. are transferred concurrently with the feeding of components at the other component feed part including the other component feed mechanism, such as another tray type component feed mechanisms 307, or the cassette type component feed part 313 equipped with component feed cassettes 312, etc., an operation for handling a predetermined number of electronic components 302, or the like, in the same manner, for example, for mounting the components to the earlier-mentioned split circuit board, is improved in efficiency.

As described above in detail, in an object to be mounted supporting device of the component mounting apparatus of the second embodiment, the components supplied from each of component feed parts arranged at the both sides of the transfer path, which sends the object to be mounted to the component mounting position and then carries out the object after having the components mounted thereto, are caught by the mounting head and mounted to the predetermined position on the object.

The object to be mounted supporting device is constructed of the positioning support stage for positioning and supporting the object to the component mount position of the transfer path, and the moving mechanism for reciprocating the positioning support stage between the component feed parts at both sides of the transfer path. When the mounting head is to pick up the component from the component feed part astride the transfer path, the positioning support stage is moved by the moving mechanism towards the component feed part to which the mount head moves, thereby supplying the object to mount the component thereto.

In this construction, a difference of required times after the component is caught before the component is mounted to the predetermined position on the object is reduced between when components of various kinds are sequentially picked up and mounted without the mounting head's passing the transfer path, and when components of various kinds are picked up and sequentially mounted by the mounting head passing the transfer path. Accordingly, the high-speed mounting is facilitated without particularly deteriorating the work efficiency and without the mounting order for components taken into account.

The positioning support stage can be moved together with the mounting head or before the mounting head catches and mounts the components.

This construction eliminates a special time for making the positioning support stage move following the mounting head moving astride the transfer path, not impeding in the high-speed mounting for the components.

Further, the mounting head which moves up and down includes the component mounting tools for catching the components from the component feed parts and mounting the components to the object to be mounted, the area sensor for detecting whether the mounting head is positioned within the component mounting range on the positioning support stage. As such, it is constructed so the positioning support stage Is prohibited from moving when the area sensor detects that the mounting head is not present in the component mounting range.

According to the above construction, based on the detection of the positional relation-ship by the hardware means, i.e., the area sensor, in any case including control errors, malfunctions and the like, it can be surely avoided that the positioning support stage moves towards the mounting head thereby interfering with the mounting head at a time when the component mounting tools are in a descended state with the mounting head being outside the component mounting range on the positioning support stage.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component mounting apparatus comprising:

a transfer device for transferring an object in a transfer direction along a transfer path having a first side and a second side, said transfer device being capable of additionally moving the object in a direction orthogonal to the transfer direction;

a component feed device disposed at the first side of the transfer path, said component feed device arranged so as to supply components to be mounted to the object in a direction orthogonal to the transfer direction;

a component holding device movable in the transfer direction and the direction orthogonal to the transfer direction, said component holding device being capable of taking a component from said component feed device, moving the component in the transfer direction and the direction orthogonal to the transfer direction, and mounting the component to the object;

an object moving device disposed along the transfer path, the object moving device being capable of holding the object and moving the object in the transfer direction and the direction orthogonal to the transfer direction; and a control device for controlling said transfer device so as to position the object next to said component feed device, said control device controlling a recognition operation for an arrangement position of the object in order to correct a movement amount of the component holding device with respect to a component mounting position on the object after the object is moved next to said component feed device but before the component is mounted to the object, wherein the control device is operable to perform the recognition operation for the arrangement position of the object by picking up an image of a position detection mark formed on the object by means of an image pickup device installed in the component holding device, and wherein a shift amount of the position detection mark is to be a correction amount in movement of the component holding device.

2. A component mounting apparatus according to claim 1, wherein the transfer path is linear.

3. A component mounting apparatus according to claim 1, further comprising a second component feed device disposed at the second side of the transfer path, said second component feed device being arranged so as to supply a second set of components to be mounted to the object in a second direction orthogonal to the transfer direction, wherein said component holding device is capable of taking a second component of the second set of components from said second component feed device, moving the second component in the transfer direction and the second direction orthogonal to the transfer direction, and mounting the second component to the object, wherein said object moving device is capable of moving the object in the transfer direction and the first direction orthogonal to the transfer direction, and wherein said control device is capable of controlling said transfer device so as to position the object next to said second component feed device, said control device controlling a second recognition operation for a second arrangement position of the object in order to correct a second movement amount of said second component holding device with respect to a second component mounting position on the object after the object is moved next to said second component feed device but before the second component is mounted to the object.

4. A component mounting apparatus according to claim 1, further comprising a recognition device disposed adjacent to said component feed device.

5. A component mounting apparatus comprising:

a transfer device for transferring an object, having an image detection mark formed thereon, in a transfer direction along a transfer path having a first side and a second side, said transfer device being capable of additionally moving the object in a direction orthogonal to the transfer direction;

a first component feed device disposed at a first side of the transfer path, said first component feed device arranged so as to supply a first set of components to be mounted to the object in a first direction orthogonal to the transfer direction;

a second component feed device disposed at a second side of the transfer path, said second component feed device arranged so as to supply a second set of components to be mounted to the object in a second direction orthogonal to the transfer direction;

a component holding device movable in the transfer direction, in the first direction orthogonal to the transfer direction, and the second direction orthogonal to the transfer direction, said component holding device being capable of taking a first component of said first set of components from said first component feed device, moving the first component in the transfer direction and the first direction orthogonal to the transfer direction, and mounting the first component to the object, said component holding device being capable of taking a second component of said second set of components from said second component feed device, moving the second component in the transfer direction and the second direction orthogonal to the transfer direction, and mounting the second component to the object;

an image pickup device in said component holding device, said image pickup device being capable of detecting an image of the position detection mark;

an object moving device disposed along the transfer path, the object moving device being capable of holding the object and moving the object in the transfer direction, in the first direction orthogonal to the transfer direction, and in the second direction orthogonal to the transfer direction;

a control device for controlling said transfer device so as to position the object next to said first component feed device, controlling a recognition operation for an arrangement position of the object in order to correct a movement amount of the component holding device with respect to a first component mounting position on the object after the object is moved next to said first component feed device but before the first component is mounted to the object, said control device controlling said transfer device so as to position the object next to said second component feed device, controlling a recognition operation for an arrangement position of the object in order to correct a movement amount of the component holding device with respect to a second component mounting position on the object after the first component is mounted to the object and after the object is moved next to said second component feed device, but before the second component is mounted to the object; and a first recognition device arranged at the first side of the transfer path, said first recognition device for recognizing the first component held by said first component holding device, a second recognition device arranged at the second side of the transfer path, said second recognition device for recognizing the second component held by said second component holding device, wherein after said control device controls said transfer device so as to position the object next to said first component feed device, but before the first component is mounted, said control device further controls said transfer device so as to arrange the object at a position that minimizes a distance between said first recognition device and the first component mounting position on the object, wherein after said control device controls said transfer device so as to position the object next to said second component feed device, but before the second component is mounted, said control device further controls said transfer device so as to arrange the object at a position that minimizes a distance between said second recognition device and the second component mounting position on the object, wherein the control device controls a first recognition operation for a first arrangement position of the object in order to correct a first movement amount of the component holding device with respect to the first component mounting position on the object before the first component is mounted after said control device further controls said transfer device go as to arrange the object at a position that minimizes a distance between said first recognition device and the first component mounting position on the object, wherein the control device controls a second recognition operation for a second arrangement position of the object in order to correct a second movement amount of the component holding device with respect to the second component mounting position on the object before the second component is mounted after said control device further controls said transfer device so as to arrange the object at a position that minimizes a distance between said second recognition device and the second component mounting position on the object, wherein the control device is operable to perform the first recognition operation for the first arrangement position and the second recognition operation for the second arrangement position with the image of the position detection mark by means of said image pickup device, wherein the control device is operable to perform the second recognition operation for the second arrangement position of the object by picking up the image of the position detection mark formed on the object by means of said image pickup device installed in said component holding device, and wherein a shift amount of the position detection mark is to be a correction amount in movement of the component holding device.

6. A component mounting apparatus according to claim 5, wherein the transfer path is linear.

* * * * *

UNITED STATES PATENT AND TRADEMARK OFFICE
CERTIFICATE OF CORRECTION

PATENT NO. : 6,374,484 B1
DATED : April 23, 2002
INVENTOR(S) : Noriaki Yoshida et al.

It is certified that error appears in the above-identified patent and that said Letters Patent is hereby corrected as shown below:

<u>Title page,</u>
Item [73], "Tokyo" should be -- Osaka --.

Signed and Sealed this

Twelfth Day of November, 2002

Attest:

Attesting Officer

JAMES E. ROGAN
*Director of the United States Patent and Trademark Office*